(12) United States Patent
Watanabe et al.

(10) Patent No.: US 10,109,669 B2
(45) Date of Patent: Oct. 23, 2018

(54) SOLID-STATE IMAGING DEVICE AND ELECTRONIC APPARATUS

(71) Applicant: SONY CORPORATION, Tokyo (JP)

(72) Inventors: Taiichiro Watanabe, Kanagawa (JP); Ryosuke Nakamura, Kanagawa (JP); Yusuke Sato, Kanagawa (JP); Fumihiko Koga, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/533,904

(22) PCT Filed: Dec. 11, 2015

(86) PCT No.: PCT/JP2015/084783
§ 371 (c)(1),
(2) Date: Jun. 7, 2017

(87) PCT Pub. No.: WO2016/098696
PCT Pub. Date: Jun. 23, 2016

(65) Prior Publication Data
US 2017/0338272 A1    Nov. 23, 2017

(30) Foreign Application Priority Data

Dec. 18, 2014 (JP) ................................ 2014-256043
Dec. 9, 2015 (JP) ................................ 2015-239945

(51) Int. Cl.
    *H01L 27/146*      (2006.01)
    *H04N 5/378*      (2011.01)

(52) U.S. Cl.
    CPC .... *H01L 27/14656* (2013.01); *H01L 27/1463* (2013.01); *H01L 27/1464* (2013.01);
(Continued)

(58) Field of Classification Search
None
See application file for complete search history.

(56) References Cited

U.S. PATENT DOCUMENTS

| | | | |
|---|---|---|---|
| 5,235,196 A | | 8/1993 | Anagnostopoulos et al. |
| 9,947,703 B2 * | | 4/2018 | Azami ............. H01L 27/14614 |

(Continued)

FOREIGN PATENT DOCUMENTS

| | | | |
|---|---|---|---|
| JP | 62-230273 A | 10/1987 | |
| JP | 6-303528 A | 10/1994 | |

(Continued)

OTHER PUBLICATIONS

International Search Report prepared by the Japan Patent Office dated Feb. 3, 2016, for International Application No. PCT/JP2015/084783.

*Primary Examiner* — Reema Patel
*Assistant Examiner* — Steven Christopher
(74) *Attorney, Agent, or Firm* — Sheridan Ross P.C.

(57) ABSTRACT

The present technology relates to a solid-state imaging device and an electronic apparatus that perform a stable overflow from a photodiode and prevent Qs from decreasing and color mixing from occurring. A solid-state imaging device according to an aspect of the present technology includes, at a light receiving surface side of a semiconductor substrate, a charge retention part that generates and retains a charge in response to incident light, an OFD into which the charge saturated at the charge retention part is discharged, and a potential barrier that becomes a barrier of the charge that flows from the charge retention part to the OFD, the OFD including a low concentration OFD and a high concentration OFD having different impurity concentrations of the same type, and the high concentration OFD and the potential barrier being formed at a distance. For example, the present technology is applicable to a CMOS image sensor.

20 Claims, 25 Drawing Sheets

(52) U.S. Cl.
CPC .. *H01L 27/14616* (2013.01); *H01L 27/14638* (2013.01); *H01L 27/14641* (2013.01); *H04N 5/378* (2013.01)

(56) References Cited

U.S. PATENT DOCUMENTS

2013/0032919 A1* 2/2013 Watanabe ........... H01L 27/1461
257/443
2014/0367552 A1* 12/2014 Hynecek ........... H01L 27/14614
250/208.1
2015/0237276 A1 8/2015 Hynecek

FOREIGN PATENT DOCUMENTS

| | | |
|---|---|---|
| JP | 2007-96271 A | 4/2007 |
| JP | 2013-38118 A | 2/2013 |
| JP | 2013-172202 A | 9/2013 |
| JP | 2014-127519 A | 7/2014 |
| JP | 2014-225560 A | 12/2014 |
| WO | WO 2011/043432 A1 | 4/2011 |

\* cited by examiner

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2015/084783 having an international filing date of 11 Dec. 2015, which designated the United States, which PCT application claimed the benefit of Japanese Patent Application No. 2014-256043 filed 18 Dec. 2014, and Japanese Patent Application No. 2015-239945 filed 9 Dec. 2015, the disclosures of which are incorporated herein by reference in their entirety.

TECHNICAL FIELD

The present technology relates to a solid-state imaging device and an electronic apparatus, and more particularly to a solid-state imaging device and an electronic apparatus that perform a stable overflow from a photodiode.

BACKGROUND ART

As a solid-state imaging device mounted in a digital still camera, a digital video camera, or the like, a CMOS (Complementary Metal Oxide Semiconductor) image sensor is known. In the CMOS image sensor (hereinafter referred to as CIS), a charge is generated in response to incident light through photoelectric conversion by a PD (Photodiode) formed for each pixel, the generated charge is transferred to an FD (Floating Diffusion) via a transfer transistor, and the charge is converted into electrical signals (pixel signals) in the FD, which are read.

Meanwhile, conventionally, a configuration, in which PDs are formed in the deep portion of (at a back surface side of) an Si (silicon) substrate, has been proposed in order to improve Qs (saturation charge amount) of the CIS, to form a vertical direction spectroscopy CIS where a plurality of PDs are laminated in the vertical direction, and the like. The charge generated and accumulated in the PD and read is transferred to the FD disposed at a front surface side of the Si substrate via a vertical transistor, for example, disposed in a direction perpendicular (vertical) to the Si substrate.

In a case of the above-described configuration, a distance between the PD and the FD is long, and the vertical transistor is fixed to a low voltage during charge accumulation in the PD. Therefore, it is difficult to design the overflow. For that reason, a structure, in which an overflow drain (hereinafter referred to as OFD) is provided at a back surface side of the Si substrate, has been proposed (see Patent Literature 1, for example).

FIG. 1 shows a configuration example of a CMOS image sensor including a PD and an OFD at a back surface side of an Si substrate. It should be noted that A of FIG. 1 is a cross-sectional diagram, and B of FIG. 1 shows a potential of each part of the CIS.

A CIS 10 includes a PD 12 formed at a back surface side of (in the deep portion of) an Si substrate 11, and an FD 14 formed at a front surface side of the Si substrate 11. In addition, a vertical transistor 13 is formed in a direction perpendicular (vertical) to the Si substrate 11. Further, an OFD 16 connected to the PD 12 via a potential barrier 15 is formed at the back surface side of (in the deep portion of) the Si substrate 11. The OFD 16 includes a high concentration diffusion layer whose voltage is set at the power source voltage.

Potential levels of the PD 12, the potential barrier 15, and the OFD 16 are as shown in B of FIG. 1. In a case where the charge generated and accumulated in the PD 12 are saturated, the saturated charge is discharged into the OFD 16 via the potential barrier 15.

CITATION LIST

Patent Literature

Patent Literature 1: Japanese Patent Application Laid-open No. 2013-38118

DISCLOSURE OF INVENTION

Technical Problem

In the configuration shown in A of FIG. 1, the potential levels of the PD 12, the potential barrier 15, and the OFD 16 are theoretically those shown in B of FIG. 1. However, the OFD 16 is the high concentration diffusion layer, and the distance between the OFD 16 and the potential barrier 15 is small. Therefore, if the PD 12, the potential barrier 15, and the OFD 16 are misaligned or their impurity concentrations are different when forming them, the potential level of the potential barrier 15 is likely to be changed greatly. In that case, Qs may be decreased, and color mixing with adjacent pixels may occur.

The present technology is made in view of the above-mentioned circumstances, and it is an object of the present technology to perform a stable overflow from a PD and to be able to prevent Qs from decreasing and color mixing from occurring.

Solution to Problem

A solid-state imaging device according to a first aspect of the present technology includes, at a light receiving surface side of a semiconductor substrate, a charge retention part that generates and retains a charge in response to incident light, an OFD into which the charge saturated at the charge retention part is discharged, and a potential barrier that becomes a barrier of the charge that flows from the charge retention part to the OFD, the OFD including a low concentration OFD and a high concentration OFD having different impurity concentrations of the same type, and the high concentration OFD and the potential barrier being formed at a distance.

The charge retention part and the low concentration OFD may have an equal impurity concentration of the same type.

The solid-state imaging device according to the first aspect of the present technology may further include a first vertical transistor formed from a surface of the semiconductor substrate opposite to the light receiving surface and being in contact with the high concentration OFD.

The first vertical transistor and the potential barrier may be formed at a distance.

The solid-state imaging device according to the first aspect of the present technology may further include a drain layer extending in a horizontal direction from the first vertical transistor between a pixel transistor formed at the semiconductor substrate and the charge retention part.

The drain layer may be formed of a diffusion layer including impurities of the same type as the charge retention part.

The solid-state imaging device according to the first aspect of the present technology may further include a well isolation layer that electrically isolates a lower region of a predetermined pixel transistor from another region of well regions of the semiconductor substrate, and extends in a horizontal direction from the first vertical transistor.

A potential of the lower region of the predetermined pixel transistor that is electrically isolated by the well isolation layer may be lower than a potential of the other region.

The predetermined pixel transistor may be an AMP transistor and an SEL transistor.

An RST potential being an input voltage of the AMP transistor as the predetermined pixel transistor may be lower than a drain voltage of the AMP transistor.

The predetermined pixel transistor may be an RST transistor.

The solid-state imaging device according to the first aspect of the present technology may further include a second vertical transistor formed from a surface of the semiconductor substrate opposite to the light receiving surface that reads the charge from the charge retention part.

A voltage may be applied to the high concentration OFD, the voltage being higher than a voltage generated on the charge retention part when a charge is accumulated in the charge retention part.

A voltage may be applied to the high concentration OFD, the voltage being higher than a voltage generated on the charge retention part when a charge is accumulated in the charge retention part, and being supplied via a through electrode that penetrates through the semiconductor substrate from a surface opposite to the light receiving surface of the semiconductor substrate.

The through electrode may be formed for a plurality of pixels and may be shared by the plurality of pixels.

The solid-state imaging device according to the first aspect of the present technology may further include a control unit that controls a potential of the potential barrier.

The high concentration OFD may be shared by the plurality of pixels.

A plurality of layers of the charge retention part may be laminated in the semiconductor substrate.

The solid-state imaging device according to the first aspect of the present technology may further include a photoelectric conversion film formed outside the light receiving surface of the semiconductor substrate.

An electronic apparatus according to a second aspect of the present technology is an electronic apparatus on which a solid-state imaging device is mounted, the solid-state imaging device includes, at a light receiving surface side of a semiconductor substrate, a charge retention part that generates and retains a charge in response to incident light, an OFD into which the charge saturated at the charge retention part is discharged, and a potential barrier that becomes a barrier of the charge that flows from the charge retention part to the OFD, the OFD includes a low concentration OFD and a high concentration OFD having different impurity concentrations of the same type, and the high concentration OFD and the potential barrier are formed at a distance.

Advantageous Effects of Invention

According to the first aspect of the present technology, it is possible to perform a stable overflow from the charge retention part and prevent Qs from decreasing and color mixing from occurring.

According to the second aspect of the present technology, it is possible to prevent Qs from decreasing and color mixing from occurring in the solid-state imaging device.

MODE(S) FOR CARRYING OUT THE INVENTION

Hereinafter, best modes (hereinafter referred to as embodiments) for carrying out the present technology will be described with reference to the drawings.

<First Configuration Example of Solid-State Imaging Device According to Embodiment of the Present Technology>

Figure 1:
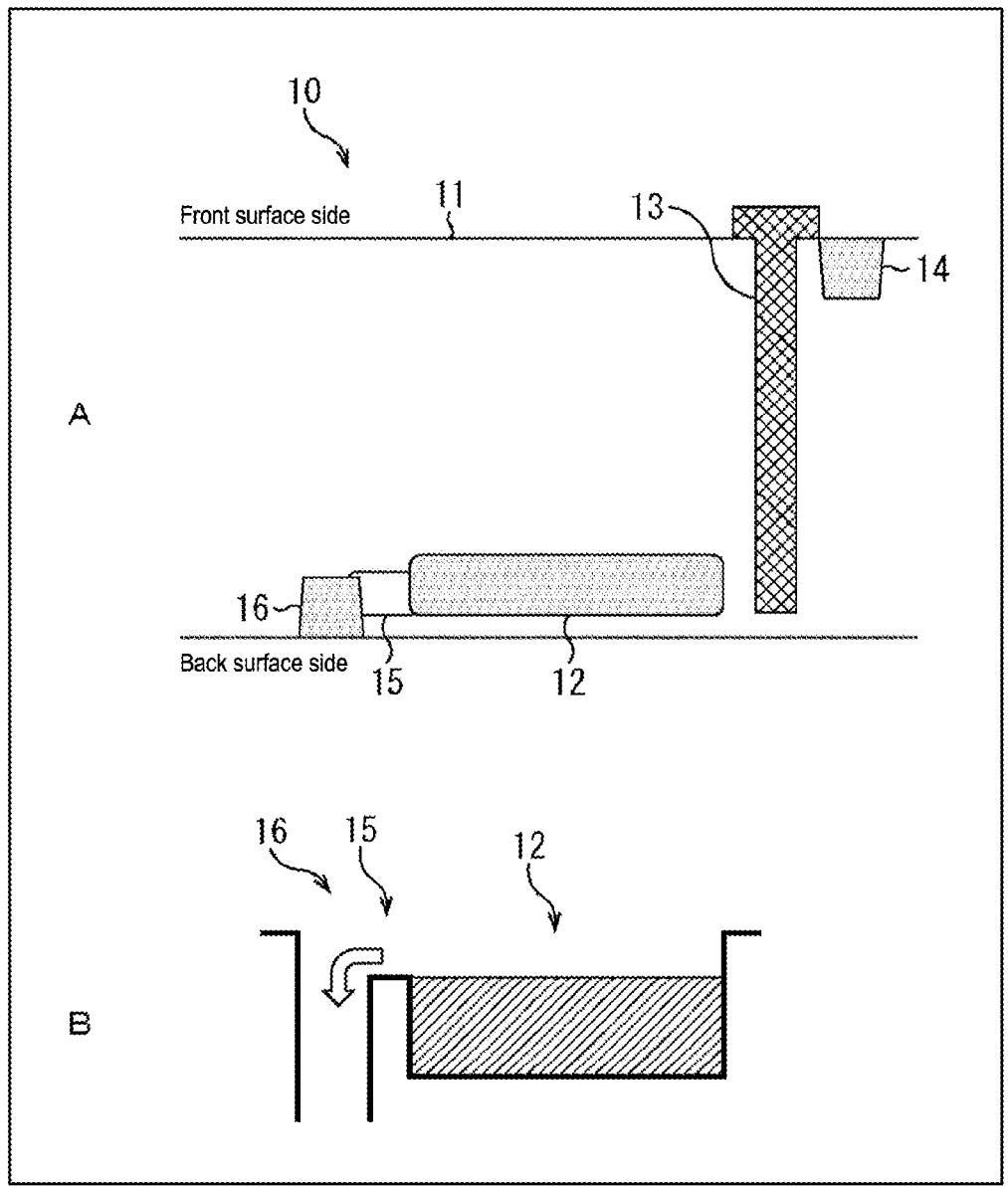
FIG. 1 is diagrams showing a configuration example of a conventional CIS.
Figure 2:
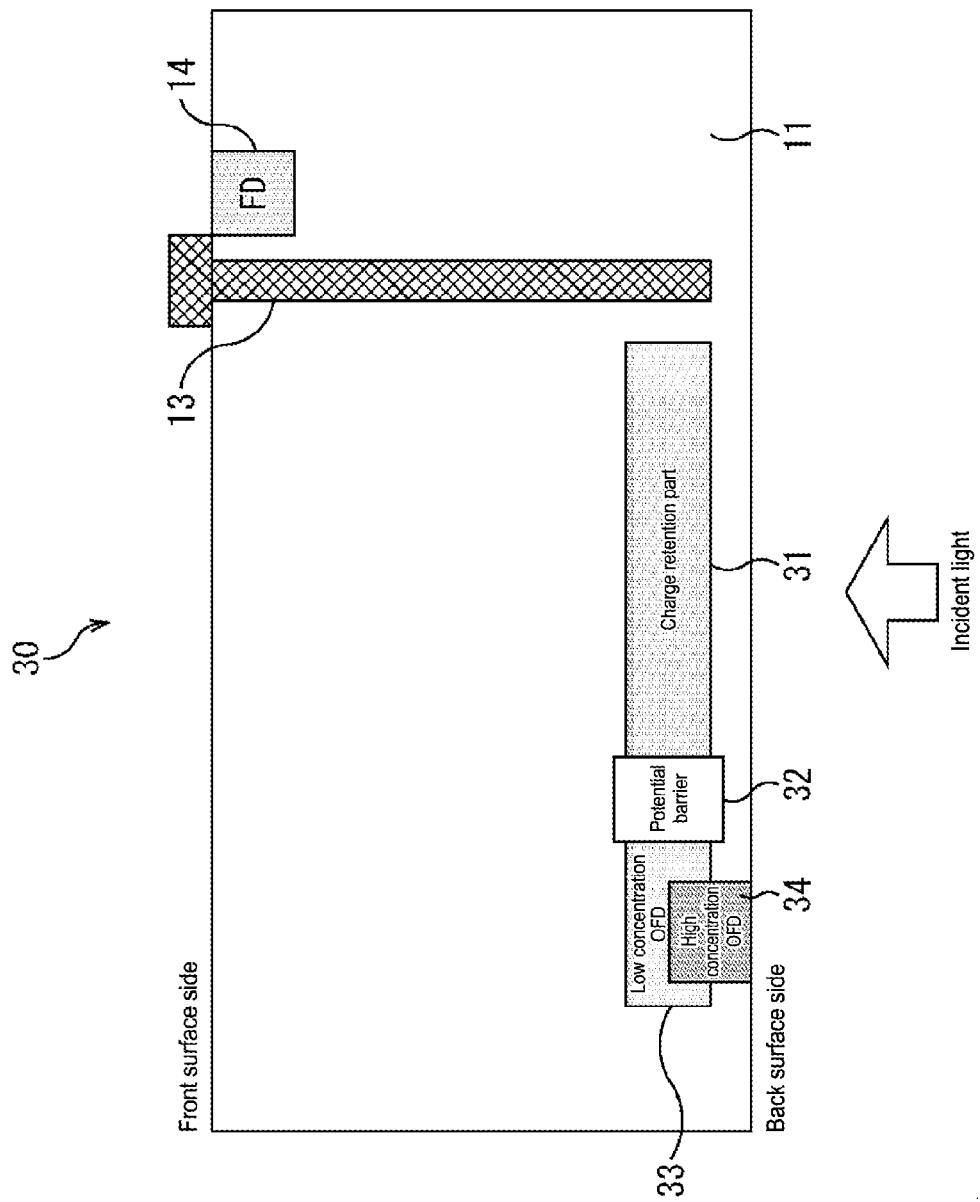
FIG. 2 is a cross-sectional diagram showing a first configuration example of a solid-state imaging device to which the present technology is applied.

FIG. 2 is a cross-sectional block diagram showing a first configuration example of the solid-state imaging device as an embodiment of the present technology. It should be noted that FIG. 2 shows one pixel, the structural components in common with the CIS in the related art shown in FIG. 1 are denoted by the same reference numerals, and thus detailed description thereof will be hereinafter omitted as appropriate.

The first configuration example of this solid-state imaging device 30 is a so-called back surface irradiation type CIS that has a PD (charge retention part) 31 formed close to a back surface of an Si substrate 11, and outputs a pixel signal in response to light irradiated from a back surface side.

In the first configuration example of the solid-state imaging device 30, a vertical transistor 13 is formed in a vertical direction (longitudinal direction) with respect to the Si substrate 11, an FD 14 is formed at a front surface side of the Si substrate 11, and a charge converted by and accumulated in the PD 31 is transferred to the FD 14 via the vertical transistor 13.

For example, the PD 31 is an N+ region (N type, impurity concentration of 1E16 to $1E18/cm^3$) formed in a P type well of the Si substrate 11, and is formed inside the Si substrate 11 at a predetermined distance from the back surface of the Si substrate 11 so as not to be in contact with the back surface.

In addition, in the solid-state imaging device 30, a potential barrier 32 including an N-region (P type, impurity concentration of 1E16 to $1E18/cm^3$) formed adjacent to the PD 31 in the horizontal direction, and a low concentration OFD 33 including N+ region (N type, impurity concentration of 1E16 to $1E18/cm^3$) having the same concentration as the PD 31 formed adjacent to the potential barrier 32 in the horizontal direction. The potential control of the potential barrier 32 is described later with reference to FIG. 12.

Furthermore, in the solid-state imaging device 30, a high concentration OFD 34 including a higher concentration N+ region (N type, impurity concentration of 1E18 to $1E20/cm^3$) than the low concentration OFD 33 is formed at a position spaced from the potential barrier 32 so as to overlap with the low concentration OFD 33 and to be in contact with the back surface side of the Si substrate 11. The high concentration OFD 34 has a fixed voltage higher than the potential generated on the PD 31 when the charge is accumulated in the PD 31 (details are described later with reference to FIG. 9 to FIG. 11).

Figure 3:
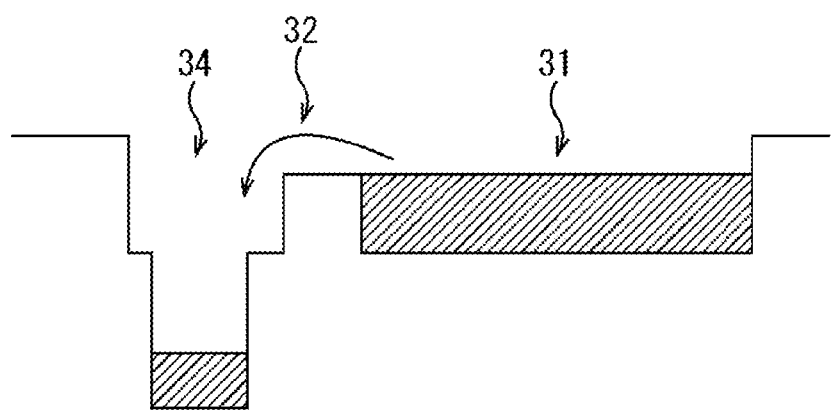
FIG. 3 shows a potential in the vicinity of a PD in the first configuration example.

FIG. 3 shows the potential in the vicinity of the PD 31 in the first configuration example of the solid-state imaging device 30. As shown in FIG. 3, the charge saturated during charge accumulation in the PD 31 flow to the low concentration OFD 33 via the potential barrier 32, and is discharged into the high concentration OFD 34.

<Manufacturing Method of First Configuration Example of Solid-State Imaging Device 30>

Figure 4:
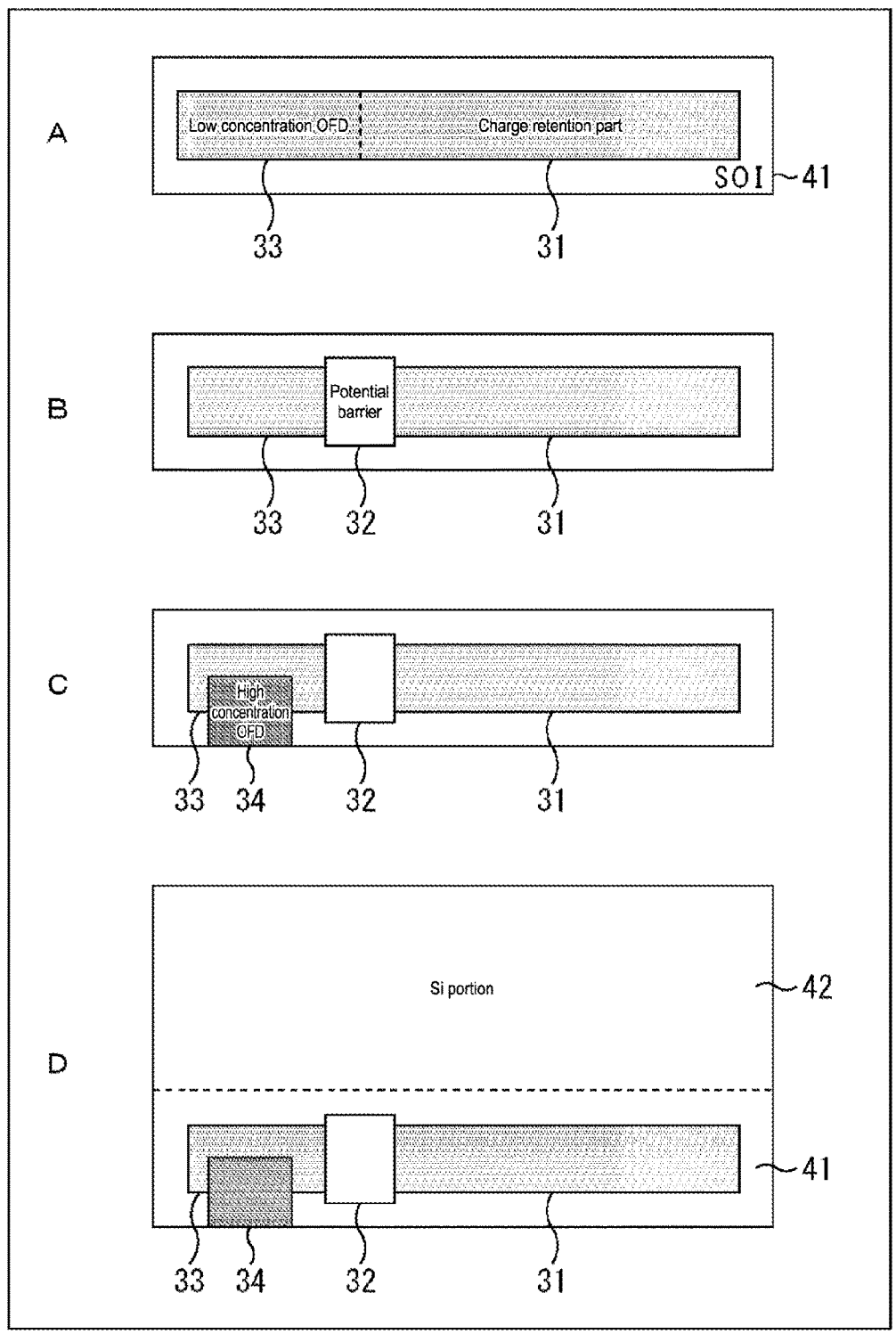
FIG. 4 is diagrams for explaining a manufacturing process of the first configuration example of the solid-state imaging device.

Next, a method of manufacturing the first configuration example of the solid-state imaging device 30 is described. FIG. 4 shows a manufacturing process of the first configuration example of the solid-state imaging device 30.

First, N type ions are implanted into an Si thin-film (SOI) 41 to form the PD (charge retention part) 31 and the low concentration OFD 33, as shown in A of FIG. 4. Note that the PD 31 and the low concentration OFD 33 are made of the same material, and they are not distinguished and integrally formed at this stage. Next, P type ions are implanted to form the potential barrier 32 between the PD 31 and the low concentration OFD 33, as shown in B of FIG. 4. Since the potential barrier 32 is formed, the PD 31 is distinguished from the low concentration OFD 33.

Next, N type ions are implanted to form the high concentration OFD 34 so as to overlap with the Si thin-film 41 and the low concentration OFD, as shown in C of FIG. 4. At this time, the high concentration OFD 34 is formed at a position spaced from the potential barrier 32 so as to overlap with the low concentration OFD 33 and to be in contact with the back surface side of the Si thin film 41. It should be noted that the high concentration OFD 34 may be formed before the potential barrier 32 is formed, and the potential barrier 32 may be formed after the high concentration OFD 34 is formed.

Finally, Si is epitaxially grown from the Si thin-film 41, and an Si portion 42 is formed, as shown in D of FIG. 4. In the Si portion 42, the vertical transistor 13, the FD 14 and the like are formed. It should be noted that P type ions may be implanted between the PD 31 and the back surface of the Si thin-film 41.

In the first configuration example of the solid-state imaging device 30 produced as described above, in a case where the charge generated in the PD 31 is read-out, the charge is transferred to the FD 14 through the vertical transistor 13. In addition, in a case where the charge generated in the PD 31 is saturated, the saturated charge flows to the low concentration OFD 33 via the potential barrier 32, and is discharged into the high concentration OFD 34.

Thus, since a route for reading out the charge is different from a route for discharging the saturated charge in the first configuration example of the solid-state imaging device 30, the charge can be more stably discharged in comparison with the configuration that the charge is discharged from the same route where the charge is read-out from the PD 31, for example.

In addition, since the high concentration OFD 34 is formed in no direct contact with the potential barrier 32 in the first configuration example of the solid-state imaging device 30, the high concentration OFD 34 can be prevented from having an effect on a potential level of the potential barrier 32. As a result, Qs can be prevented from decreasing, and color mixing with adjacent pixels can be prevented.

<Second Configuration Example of Solid-State Imaging Device According to Embodiment of the Present Technology>

Figure 5:
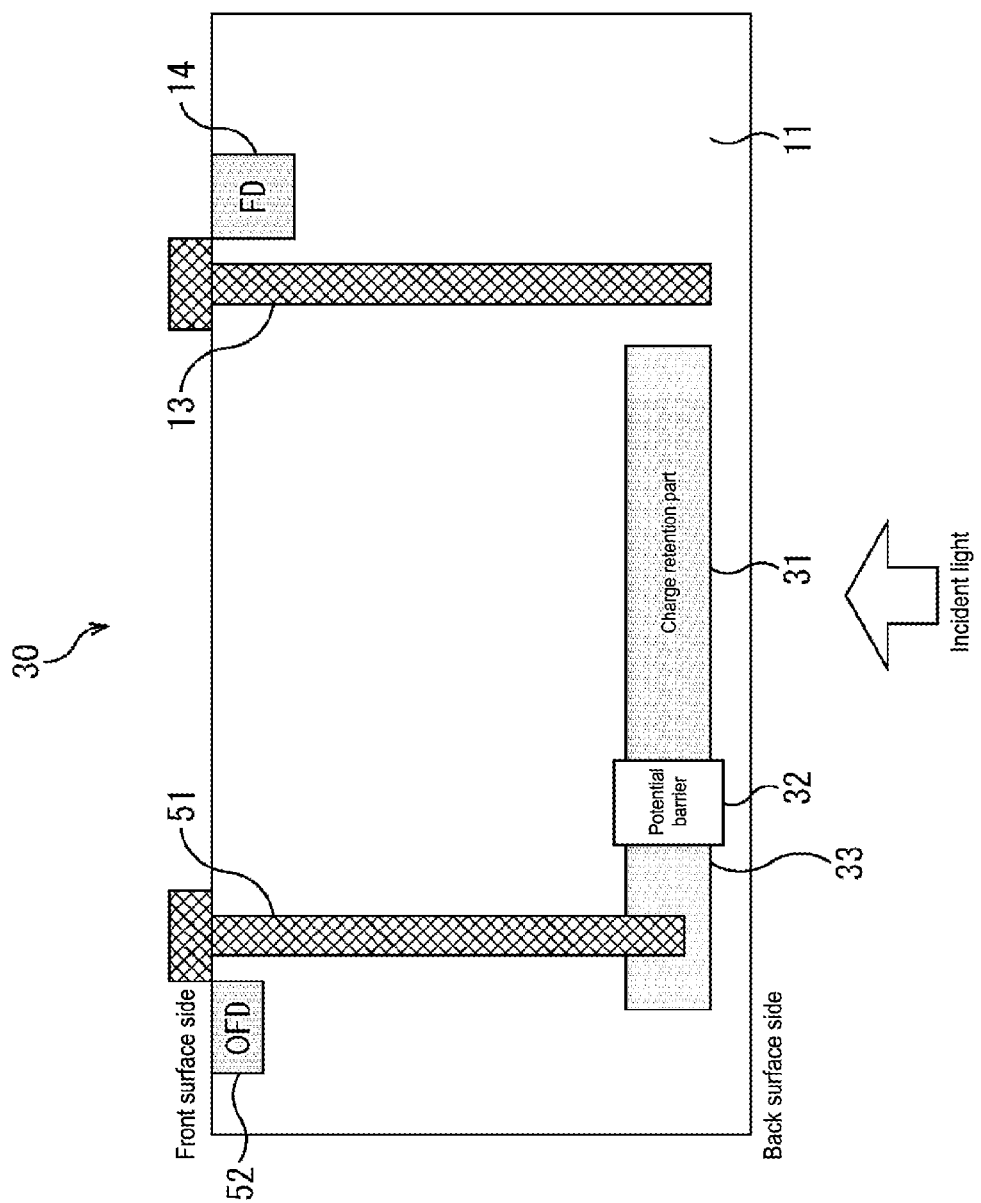
FIG. 5 is a cross-sectional diagram showing a second configuration example of a solid-state imaging device to which the present technology is applied.

FIG. 5 is a cross-sectional block diagram showing a second configuration example of the solid-state imaging device as an embodiment of the present technology. It should be noted that FIG. 5 shows one pixel, the structural components in common with the configuration example shown in FIG. 2 are denoted by the same reference numerals, and thus detailed description thereof will be hereinafter omitted as appropriate.

The second configuration example of the solid-state imaging device 30 is the back surface irradiation type CIS similar to the first configuration example, the high concentration OFD 34 of the first configuration example is omitted, and a vertical transistor (VG) 51 and an OFD 52 are provided instead.

The vertical transistor 51 is formed at a position that is in contact with the low concentration OFD 33 and is not in contact with the potential barrier 32 in the perpendicular direction (vertical direction) with respect to the Si substrate 11. The vertical transistor 51 has a fixed voltage higher than the potential generated on the PD 31 when charge is accumulated in the PD 31. The OFD 52 is formed at the front surface side of the Si substrate 11.

Figure 6:
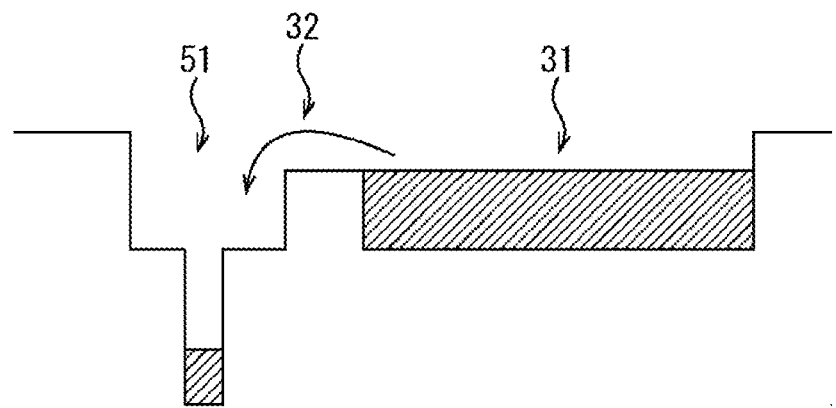
FIG. 6 shows a potential in the vicinity of a PD of the second configuration example.

FIG. 6 shows the potential in the vicinity of the PD 31 of the second configuration example of the solid-state imaging device 30.

As shown in FIG. 6, the charge saturated during charge accumulation in the PD 31 flows to the low concentration OFD 33 via the potential barrier 32, and is further discharged into the OFD 52 via the vertical transistor 51.

<Manufacturing Method of Second Configuration Example of Solid-State Imaging Device 30>

Figure 7:
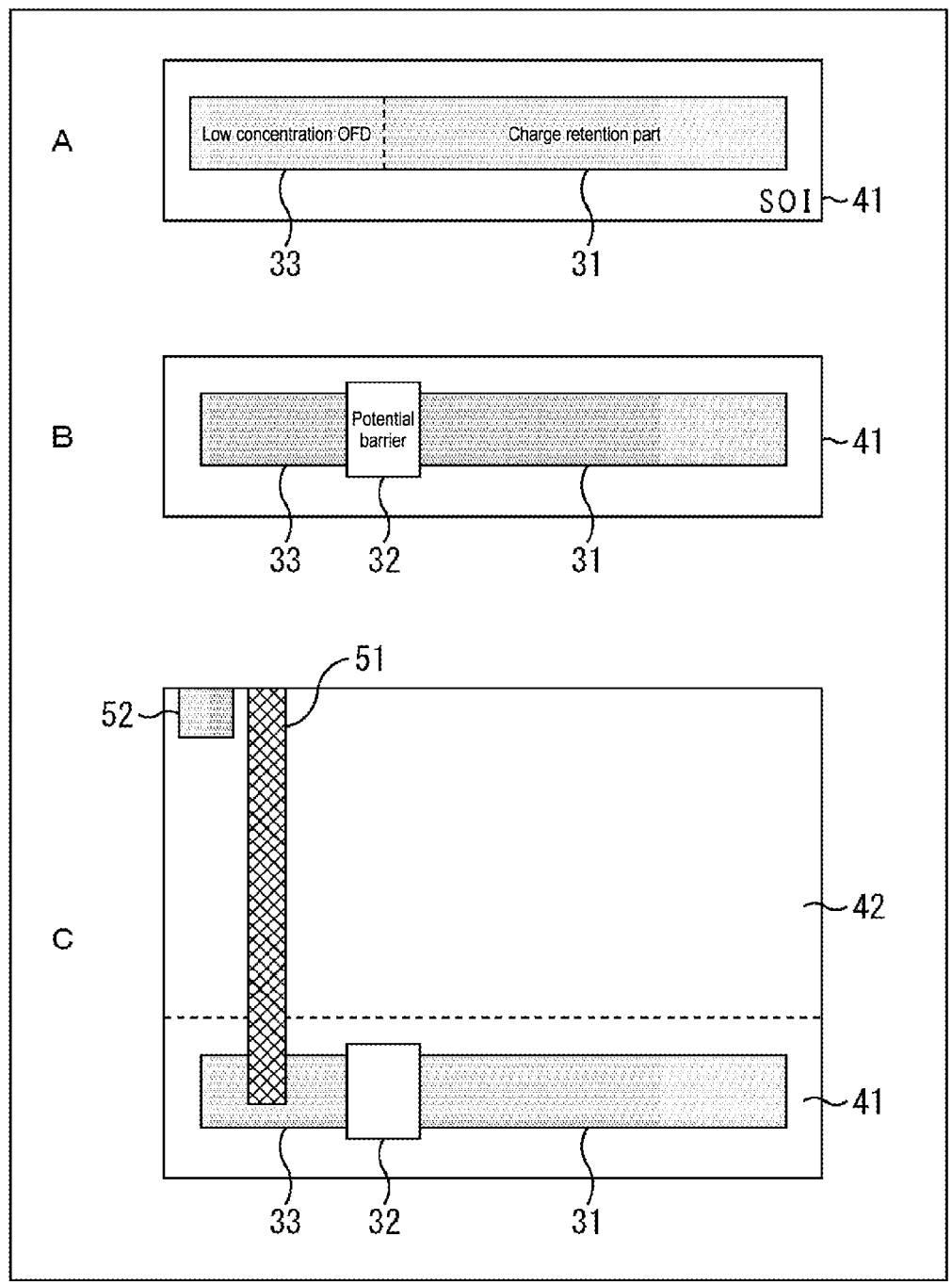
FIG. 7 is diagrams for explaining a manufacturing process of the second configuration example of the solid-state imaging device.

Next, a method of manufacturing the second configuration example of the solid-state imaging device 30 is described. FIG. 7 shows a manufacturing process of the second configuration example of the solid-state imaging device 30.

First, N type ions are implanted into the Si thin-film (SOI) 41 to form the PD (charge retention part) 31 and the low concentration OFD 33, as shown in A of FIG. 7. Note that the PD 31 and the low concentration OFD 33 are made of the same material, and they are not distinguished and integrally formed at this stage. Next, P type ions are implanted to form the potential barrier 32 between the PD 31 and the low concentration OFD 33, as shown in B of FIG. 7. Since the potential barrier 32 is formed, the PD 31 is distinguished from the low concentration OFD 33.

Finally, Si is epitaxially grown from the Si thin-film 41, and the Si portion 42 is formed, as shown in C of FIG. 7. In the Si portion 42, the vertical transistor 51, the OFD 52, the vertical transistor 13, the FD 14 and the like are formed. It should be noted that P type ions may be implanted between the PD 31 and the back surface of the Si thin-film 41.

As described above, the second configuration example of the solid-state imaging device 30 can be manufactured with a smaller number of steps than those in the first configuration example.

In the second configuration example of the solid-state imaging device 30 produced, in a case where the charge generated in the PD 31 is read-out, the pixels are transferred to the FD 14 through the vertical transistor 13. In addition, in a case where the charge generated in the PD 31 is saturated, the saturated charge flows to the low concentration OFD 33 via the potential barrier 32, and is discharged into the high concentration OFD 52 via the vertical transistor 51.

Thus, since a route for reading out the charge is different from a route for discharging the saturated charge in the second configuration example of the solid-state imaging device 30, the charge can be more stably discharged in comparison with the configuration that the charge is discharged from the same route where the charge is read-out from the PD 31, for example.

In addition, since the vertical transistor 51 is formed in no direct contact with the potential barrier 32 in the second configuration example of the solid-state imaging device 30, a voltage applied to the vertical transistor 51 can be prevented from having an effect on a potential level of the potential barrier 32. As a result, Qs can be prevented from decreasing, and color mixing with adjacent pixels can be prevented.

<Third Configuration Example of Solid-State Imaging Device According to Embodiment of the Present Technology>

Figure 8:
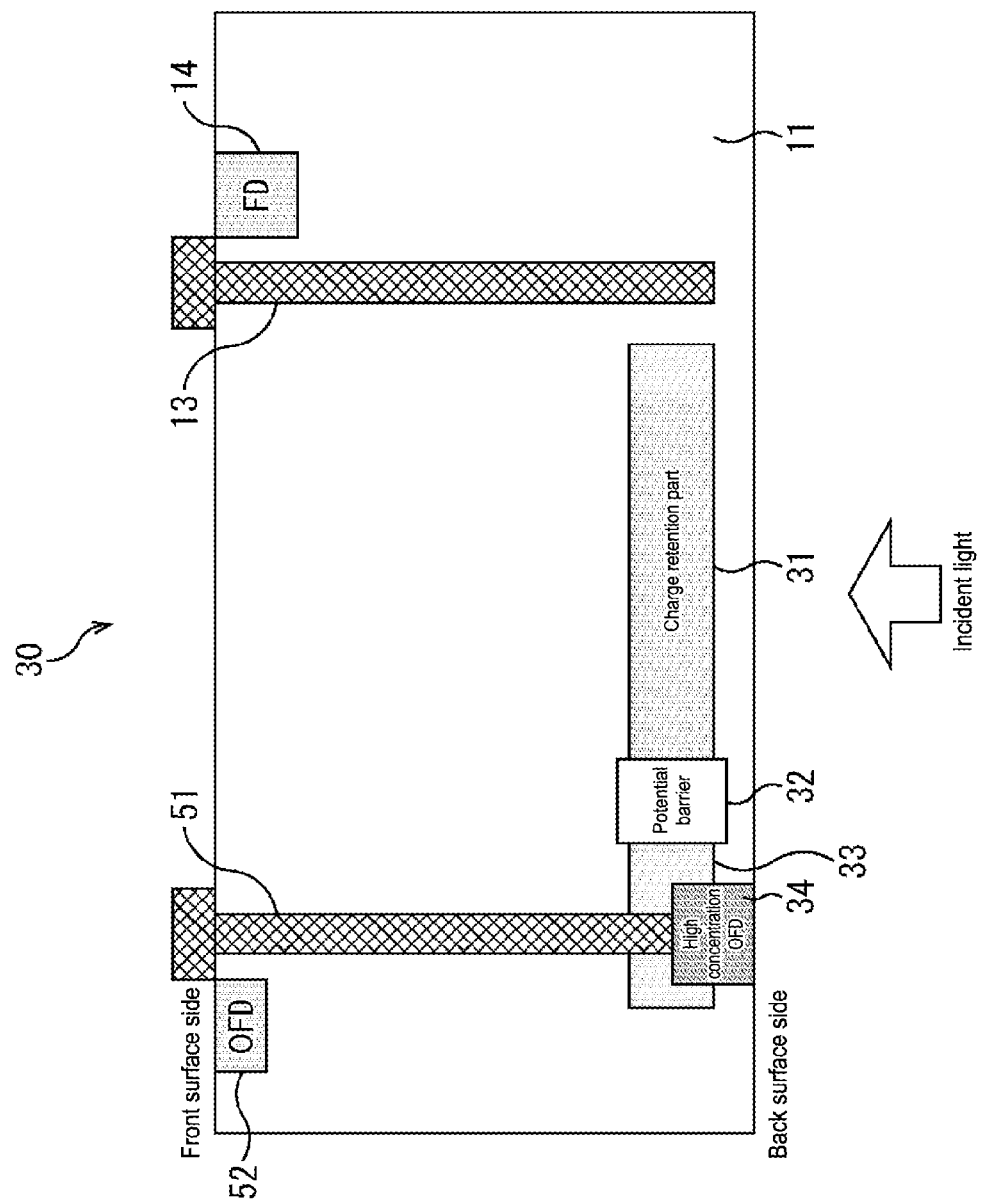
FIG. 8 is a cross-sectional diagram showing a third configuration example of a solid-state imaging device to which the present technology is applied.

FIG. 8 is a cross-sectional block diagram showing a third configuration example of the solid-state imaging device as an embodiment of the present technology. It should be noted that FIG. 8 shows one pixel, the structural components in common with the first configuration example shown in FIG. 2 or the second configuration example shown in FIG. 5 are denoted by the same reference numerals, and thus detailed description thereof will be hereinafter omitted as appropriate.

In the third configuration example of the solid-state imaging device 30, the vertical transistor 51 and the OFD 52 of the second configuration example are added to the first configuration example. The vertical transistor 51 is connected to the high concentration OFD 34.

In the third configuration example of the solid-state imaging device 30, in a case where the charge generated in the PD 31 is read-out, the charge is transferred to the FD 14 through the vertical transistor 13. In addition, in a case where the charge generated in the PD 31 is saturated, the saturated charge flows to the low concentration OFD 33 via the potential barrier 32, and is discharged into the high concentration OFD 34 or is discharged into the OFD 52 via the vertical transistor 51.

Thus, since a route for reading out the charge is different from a route for discharging the saturated charge in the third configuration example of the solid-state imaging device 30, the charge can be more stably discharged in comparison with the configuration that the charge is discharged from the same route where the charge is read-out from the PD 31, for example.

In addition, since the high concentration OFD 34 and the vertical transistor 51 are formed in no direct contact with the potential barrier 32 in the third configuration example of the solid-state imaging device 30, the high concentration OFD 34 and the vertical transistor 51 can be prevented from having an effect on a potential level of the potential barrier 32. As a result, Qs can be prevented from decreasing, and color mixing with adjacent pixels can be prevented.

<Potential Fixing Method of High Concentration OFD 34>

As described above, the high concentration OFD 34 into which the saturated charge generated in the PD 31 is discharged needs to have a fixed voltage higher than the potential generated on the PD 31 when the charge is accumulated in the PD 31. In this regard, in a case where the electrode of the high concentration OFD 34 is present at the back surface side of the Si substrate 11, a through electrode may be formed at the Si substrate 11 to electrically connect a power source at the front surface side of the Si substrate 11 to the high concentration OFD 34.

Figure 9:
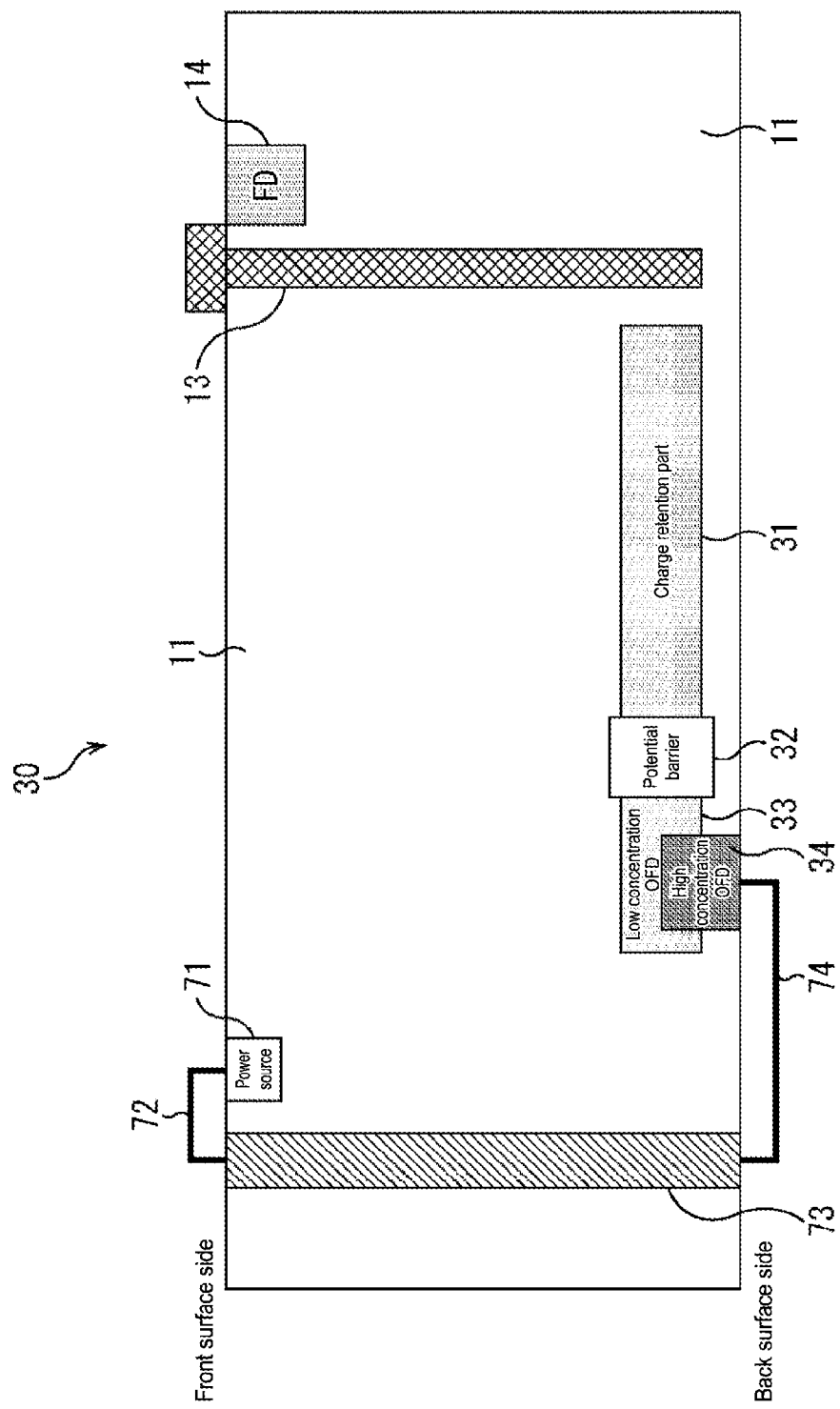
FIG. 9 is a cross-sectional diagram where a through electrode is formed for each pixel.

FIG. 9 is a configuration example where a through electrode is formed for each pixel. In this case, a high-voltage power source 71 and the high concentration OFD 34 are connected via wiring 72, a through electrode 73, and wiring 74, and the high concentration OFD 34 has a fixed higher voltage.

Figure 10:
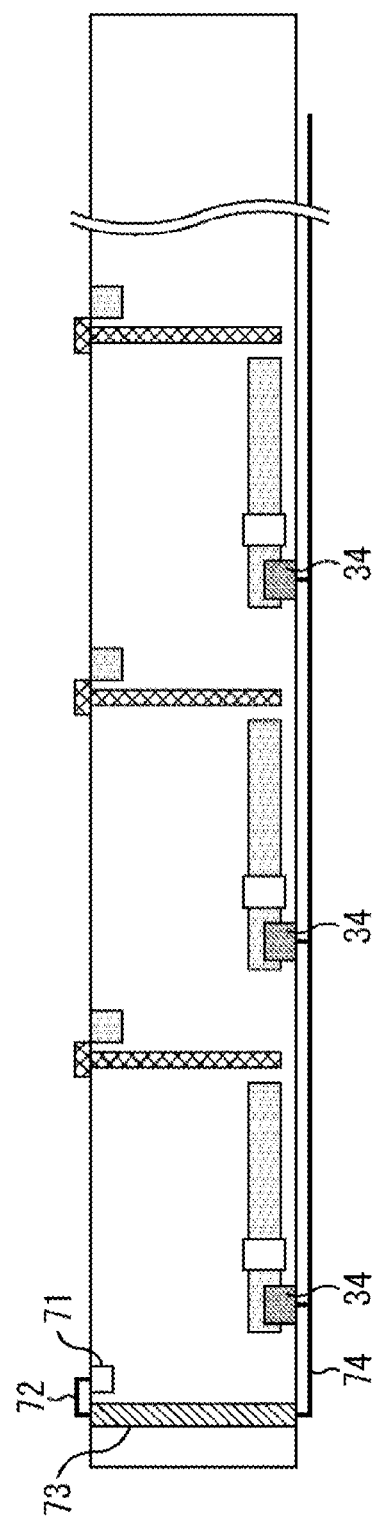
FIG. 10 is a cross-sectional diagram showing a configuration example where a plurality of pixels share a through electrode.
Figure 11:
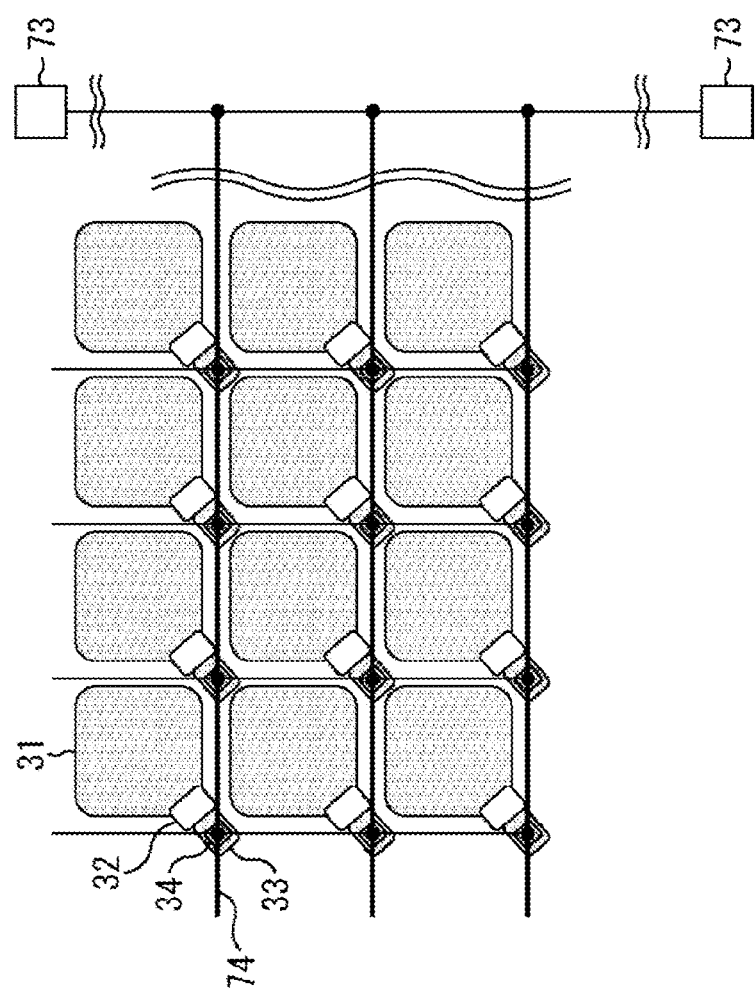
FIG. 11 is a top view corresponding to the configuration example shown in FIG. 10.

FIG. 10 and FIG. 11 show a configuration example where a plurality of pixels share a through electrode, FIG. 10 is a cross-sectional diagram, and FIG. 11 is a top view. In this case, the area occupied by each pixel can be reduced by the size of the through electrodes 73 in comparison with the case that the through electrode 73 is formed for each pixel.

<Potential Control of Potential Barrier 32>

Figure 12:
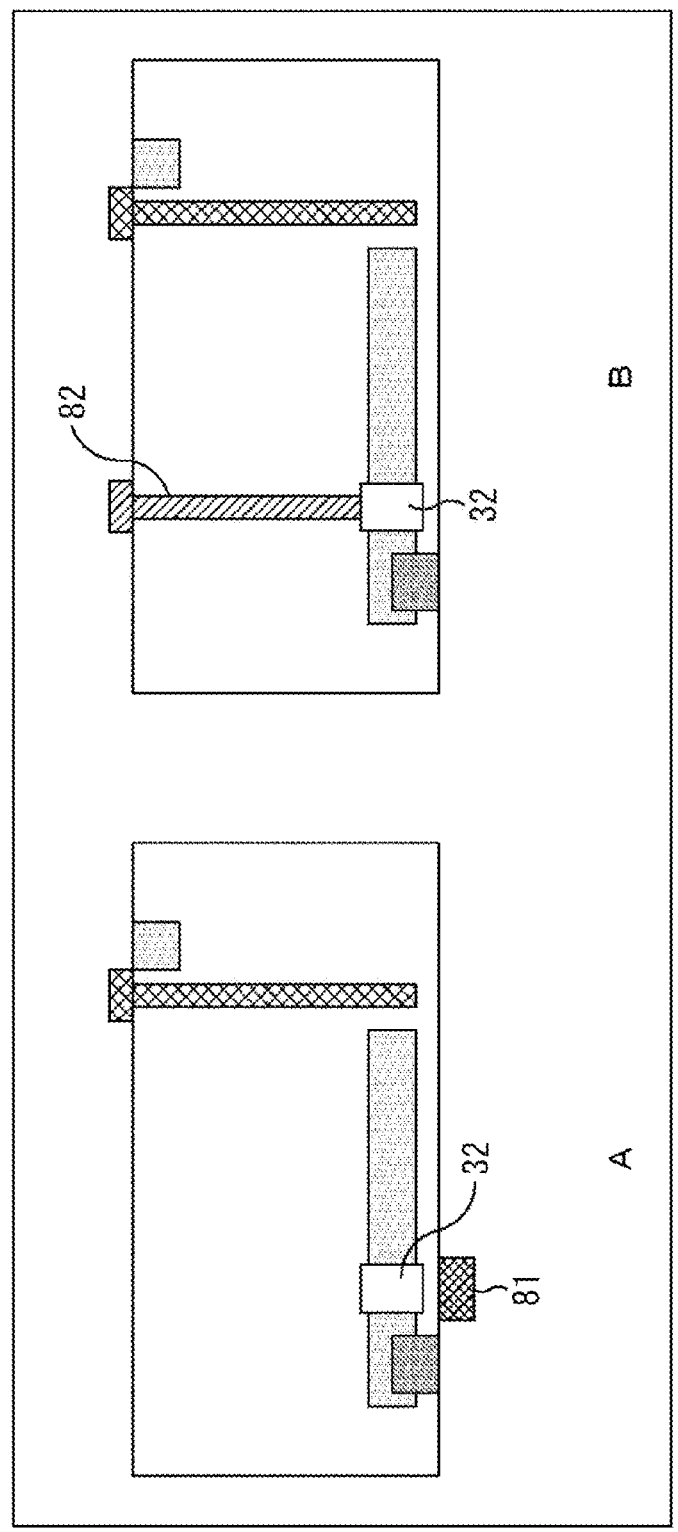
FIG. 12 are cross-sectional diagrams showing configuration examples that the potential of the potential barrier is controlled.

Next, FIG. 12 shows configuration examples that the potential of the potential barrier 32 is controlled. A of FIG. 12 shows a configuration example that a gate electrode 81 is formed at the back surface side of the Si substrate 11 and is connected to the potential barrier 32. In this case, the potential of the potential barrier 32 can be controlled by applying a predetermined voltage from the gate electrode 81. B of FIG. 12 shows a configuration example that a vertical transistor 82 is formed from the front surface side of the Si substrate 11 and is connected to the potential barrier 32. In this case, the potential of the potential barrier 32 can be controlled by applying a predetermined voltage from the vertical transistor 82.

<Modification Examples of First Configuration Example of Solid-State Imaging Device According to Embodiment of the Present Technology>

Figure 13:
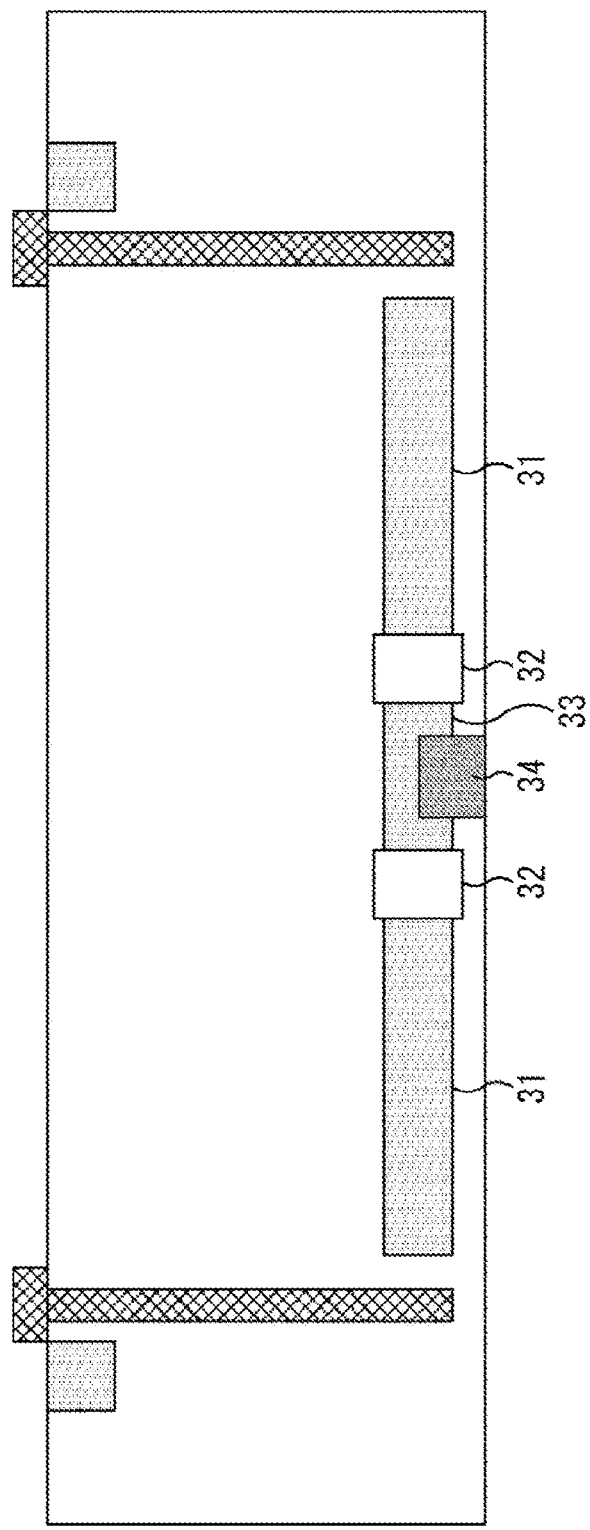
FIG. 13 is a cross-sectional diagram showing a configuration example where a plurality of pixels share a high concentration OFD.
Figure 14:
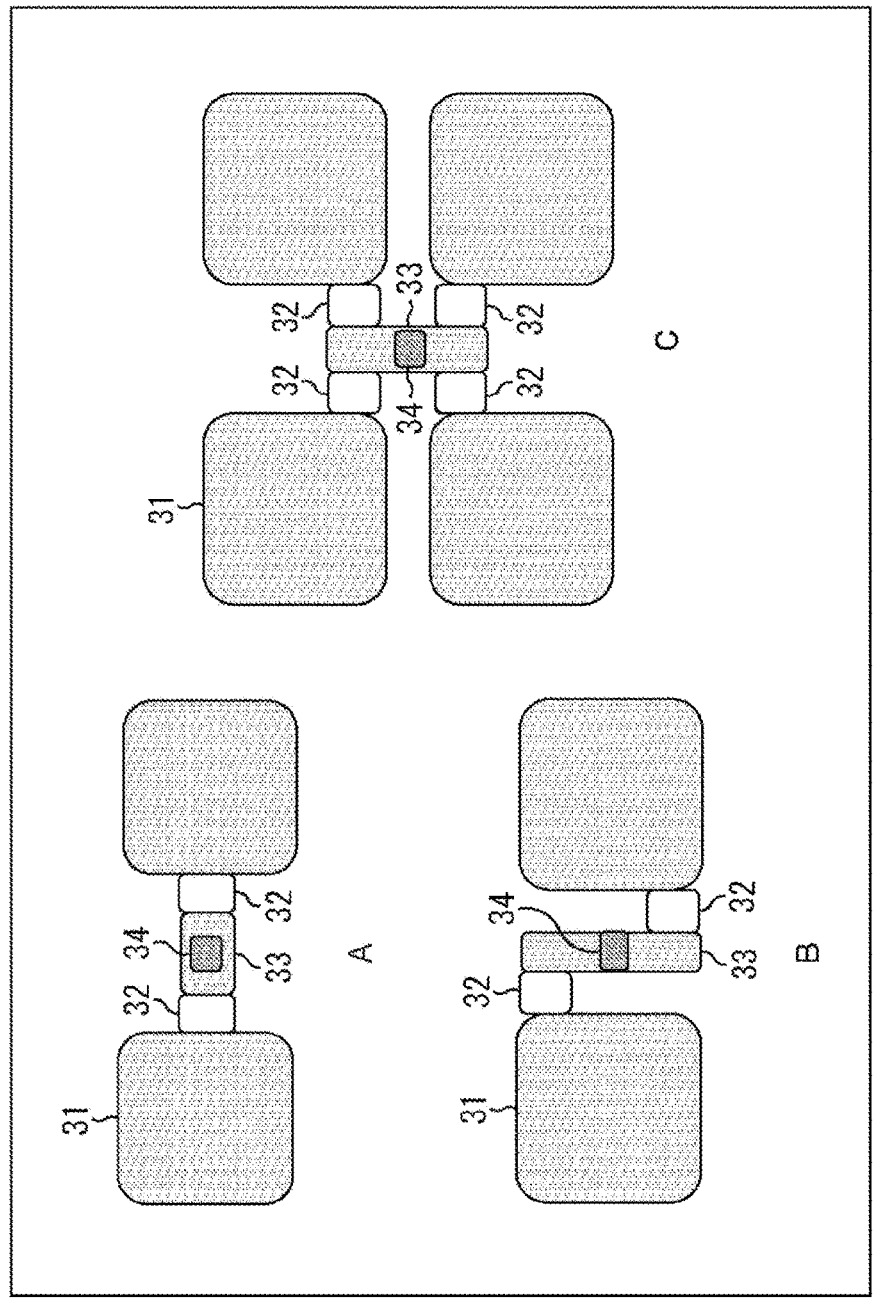
FIG. 14 are top views corresponding to the configuration example.

Next, FIG. 13 and FIG. 14 show a configuration example where a plurality of pixels share the high concentration OFD 34, FIG. 13 is a cross-sectional diagram, and FIG. 14 is a top view, as a modification example (first modification example) of the first configuration example of the solid-state imaging device shown in FIG. 2. It should be noted that A of FIG. 14 and B of FIG. 14 show the case that two pixels share the high concentration OFD 34, and C of FIG. 14 shows the case that four pixels share the high concentration OFD 34.

Since the plurality of pixels adjacent to each other share the high concentration OFD 34, the area occupied by the high concentration OFD 34 in each pixel can be reduced in comparison with the case that the high concentration OFD 34 is formed for each pixel.

Figure 15:
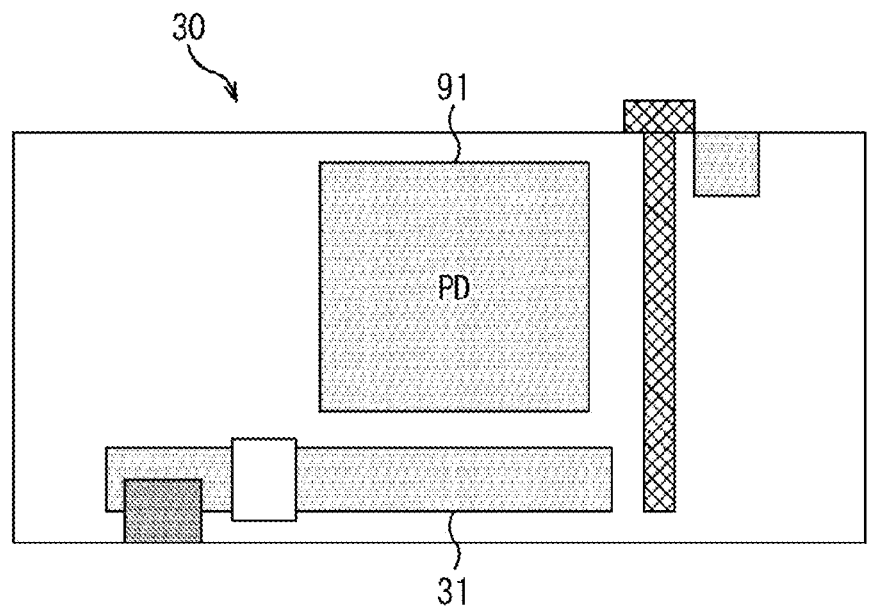
FIG. 15 is a cross-sectional diagram showing a modification example that a PD is additionally laminated in the first configuration example.

FIG. 15 is a cross-sectional diagram showing a configuration example that a PD 91 is additionally laminated in the Si substrate 11 as another modification example (second modification example) of the first configuration example of the solid-state imaging device.

As shown in FIG. 15, in a case where a plurality of PDs (charge retention part 31 and PD 91) are formed in the Si substrate 11, the PD 31 close to the back surface side mainly photoelectrically converts light of a short wavelength side, and the PD 91 distant from the back surface side mainly photoelectrically converts light of a long wavelength side. Since the plurality of PDs photoelectrically convert light beams having different wavelengths, a spectroscopic operation can be performed. Further, with the combination of outputs from the plurality of PDs, Qs can be increased. It should be noted that three or more PD layers may be formed in the Si substrate 11.

Figure 16:
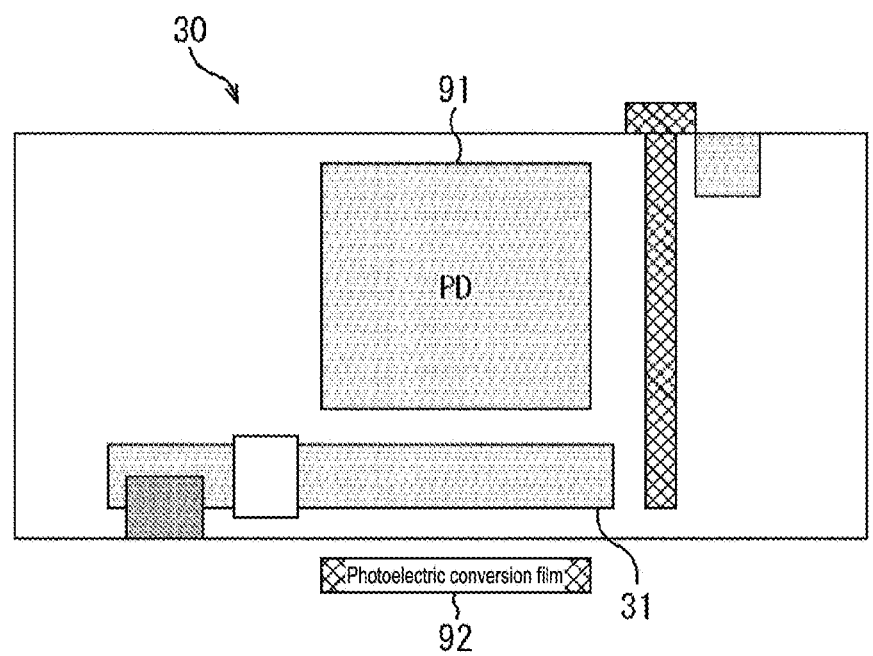
FIG. 16 is a cross-sectional diagram showing a modification example that a photoelectric conversion film is further added in the first configuration example.

FIG. 16 is a cross-sectional diagram showing a configuration example that a photoelectric conversion film 92 such as an organic photoelectric conversion film is further added outside of and distant from the back surface of the Si substrate 11 of the second modification example of FIG. 15 as still another modification example (third modification example) of the first configuration example of the solid-state imaging device.

As shown in FIG. 16, in a case where the photoelectric conversion film 92 is formed, a component photoelectrically converted by the photoelectric conversion film 92 can be taken out as an output, and light transmitted through the photoelectric conversion film 92 can be photoelectrically converted by the respective PDs 31, 91. The plurality of PDs 31, 91 and the photoelectric conversion film 92 photoelectrically convert light beams having different wavelengths, and thereby a spectroscopic operation can be performed.

<Modification Example of Second Configuration Example of Solid-State Imaging Device According to Embodiment of the Present Technology>

Figure 17:
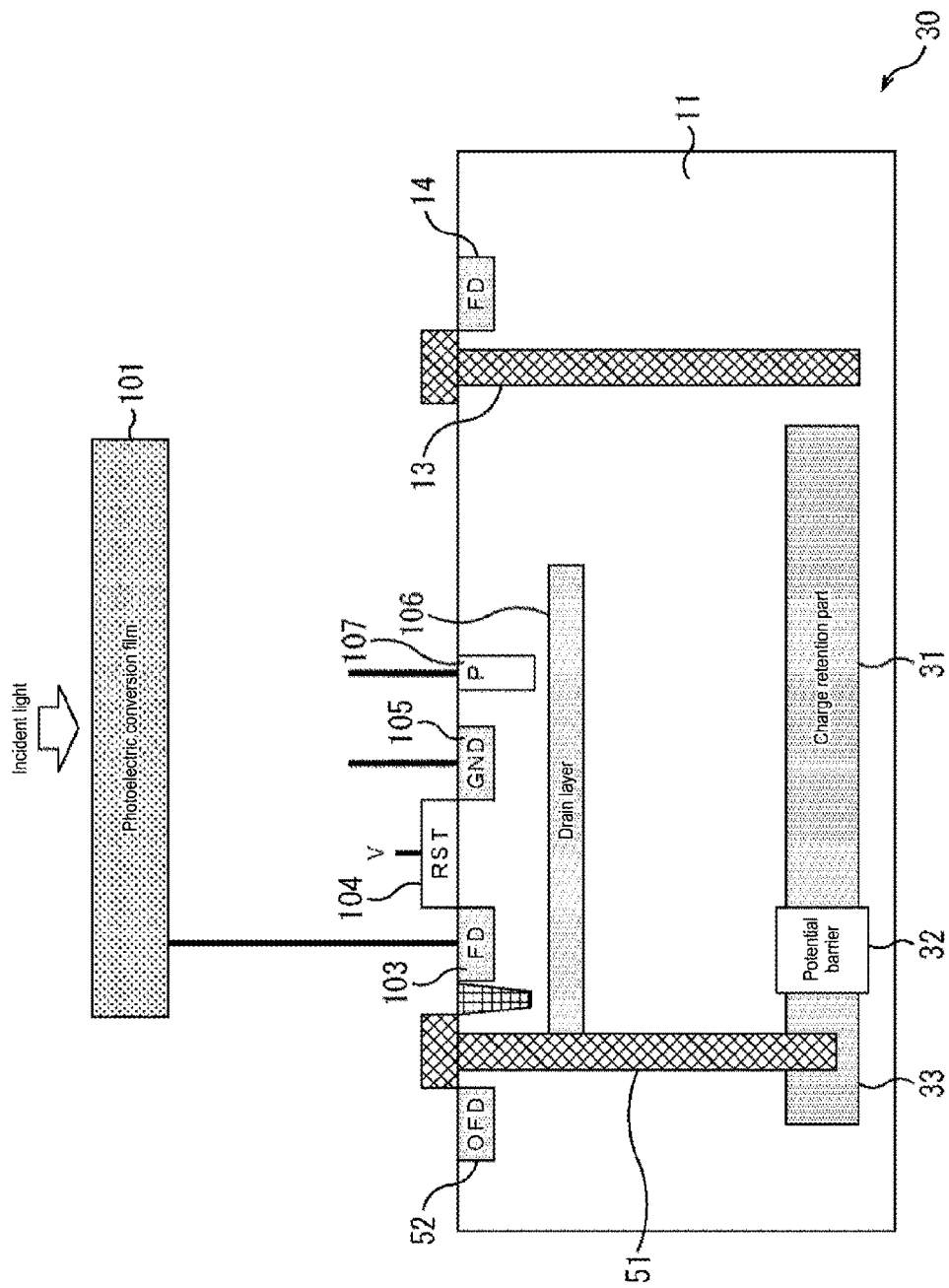
FIG. 17 is a cross-sectional diagram showing a modification example that a drain layer is further added in the second configuration example.

Next, FIG. 17 shows a modification example (fourth modification example) of the second configuration example of the solid-state imaging device shown in FIG. 5.

In the fourth modification example, a photoelectric conversion film 101 such as an organic photoelectric conversion film is added outside of and distant from the front surface of the Si substrate 11 and an FD 103 that accumulates the charge generated by the photoelectric conversion film 101 is added inside of the front surface of the Si substrate 11 of the second configuration example of FIG. 5.

In addition, a GND terminal 105 is connected to the FD 103 via an RST transistor 104 to prevent dark current flowing through the photoelectric conversion film 101. It should be noted that the GND terminal 105 has a voltage of 0 V, but it is not limited thereto. The voltage lower than VDD is acceptable. The same applies to other configuration examples and modification examples.

Further, a drain layer 106 including an N type diffusion layer extending in the horizontal direction is formed between the FD 103 and the GND terminal 105, and the charge retention part 31, and is connected to the vertical transistor 51.

In the fourth modification example, the drain layer 106 including the N type diffusion layer is turned on at all times by electric power supplied from the vertical transistor 51 connected to the power source. Thus, the drain layer 106 functions as a drain for collecting the charge leaking from the pixel transistor of the FD 103 and the GND terminal 105, a P type well contact 107 and the like. As a result, an increase of dark current flowing through the charge retention part 31 can be inhibited. It can also be expected that the vertical transistor 51 to which electric power is supplied functions as a drain for collecting the leaked charge similar to the drain layer 106. In a case where the vertical transistor 51 functions effectively as the drain, the drain layer 106 may be omitted.

It should be noted that the above-described fourth modification example may be applied to the third configuration example shown in FIG. 8.

<Another Modification Example of Second Configuration Example of Solid-State Imaging Device According to Embodiment of the Present Technology>

Figure 18:
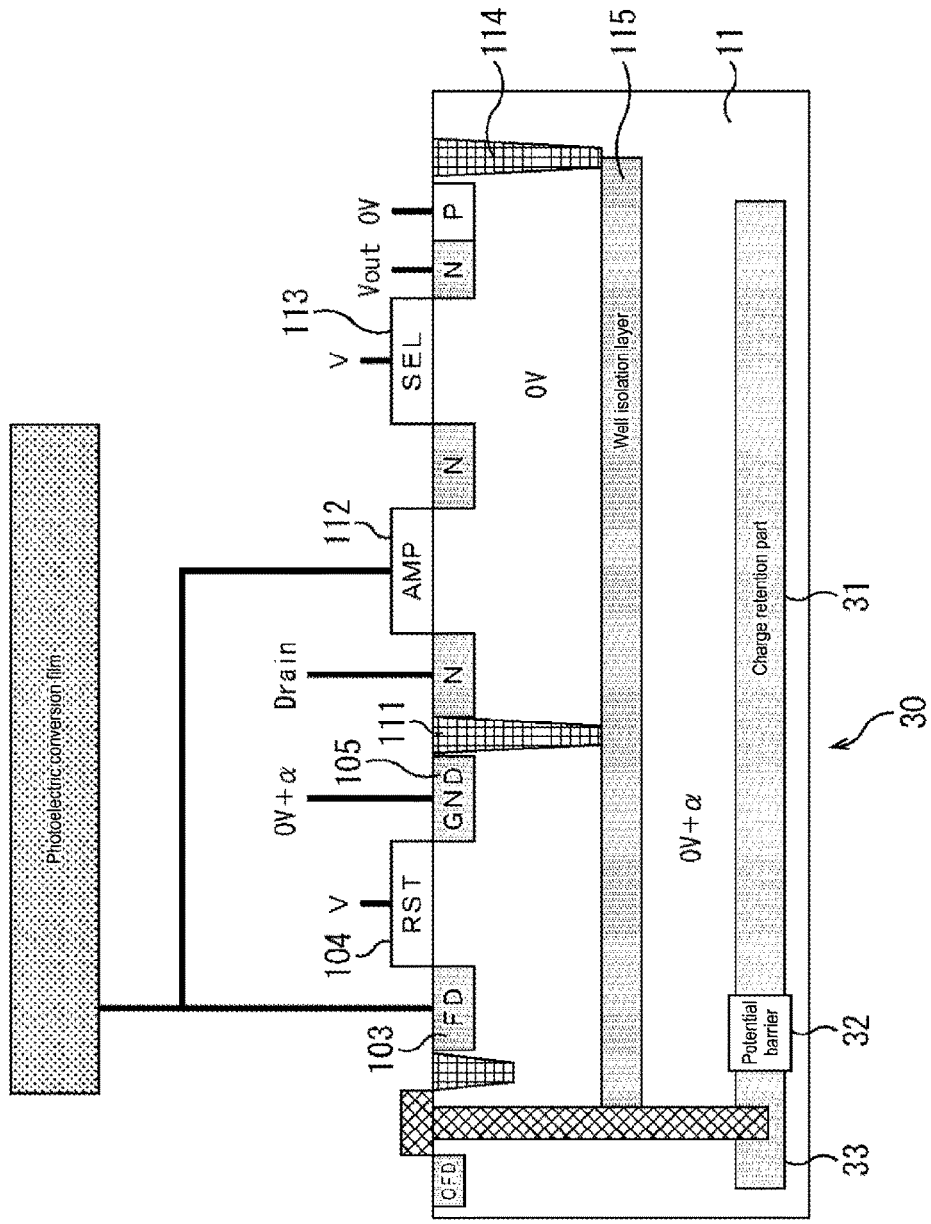
FIG. 18 is a cross-sectional diagram showing a modification example that a well isolation layer is further added in the second configuration example.

Next, FIG. 18 shows another modification example (fifth modification example) of the second configuration example of the solid-state imaging device shown in FIG. 5.

In the fifth modification example, a photoelectric conversion film 101 such as an organic photoelectric conversion film is added outside of and distant from the front surface of the Si substrate 11 and an FD 103 that accumulates the charge generated by the photoelectric conversion film 101 is added inside of the front surface of the Si substrate 11 of the second configuration example of FIG. 5.

In addition, a GND terminal 105 is connected to the FD 103 via an RST transistor 104 to prevent dark current flowing through the photoelectric conversion film 101.

In the fifth modification example, an AMP transistor 112 and an SEL transistor 113 that are omitted in the above-described configuration examples and modification examples are illustrated.

In the fifth modification example, insulators 111 and 114 are formed in the Si substrate 11, the AMP transistor 112 and the SEL transistor 113 being provided between the insulators 111 and 114.

In addition, a well isolation layer 115 including the N type diffusion layer extending in the horizontal direction is formed below the AMP transistor 112 and the SEL transistor 113. The well isolation layer 115 is extended in the horizontal direction from the vertical transistor 51, and is in contact with the insulators 111 and 114.

With such a configuration, a lower region below the AMP transistor 112 and the SEL transistor 113 is electrically isolated from the other well region (region where the RST transistor 104 for resetting the FD 103 or the like is formed), and the potential of the lower region is different from the potential of the other region. In the fifth modification example, the potential of the lower region below the AMP transistor 112 and the SEL transistor 113 is lower than the potential of the other well region.

In this manner, as a reset potential of the FD 103 can be arbitrarily set irrespective of the input voltage of the AMP transistor 112, it can inhibit degradation of the imaging characteristics relating to random noises, a driving power (gm) and the like arising from the operation point of the AMP transistor 112.

In addition, in a case where only from the viewpoint of the above-described effects obtained from the difference between the potential of the lower region below the AMP transistor 112 and the SEL transistor 113 and the potential of the region where the RST transistor 104 and the like are formed, the well isolation layer 115 does not have to be connected to the vertical transistor 51. In this case, the configuration examples shown in FIG. 19 to FIG. 22 described below can be employed.

Figure 19:
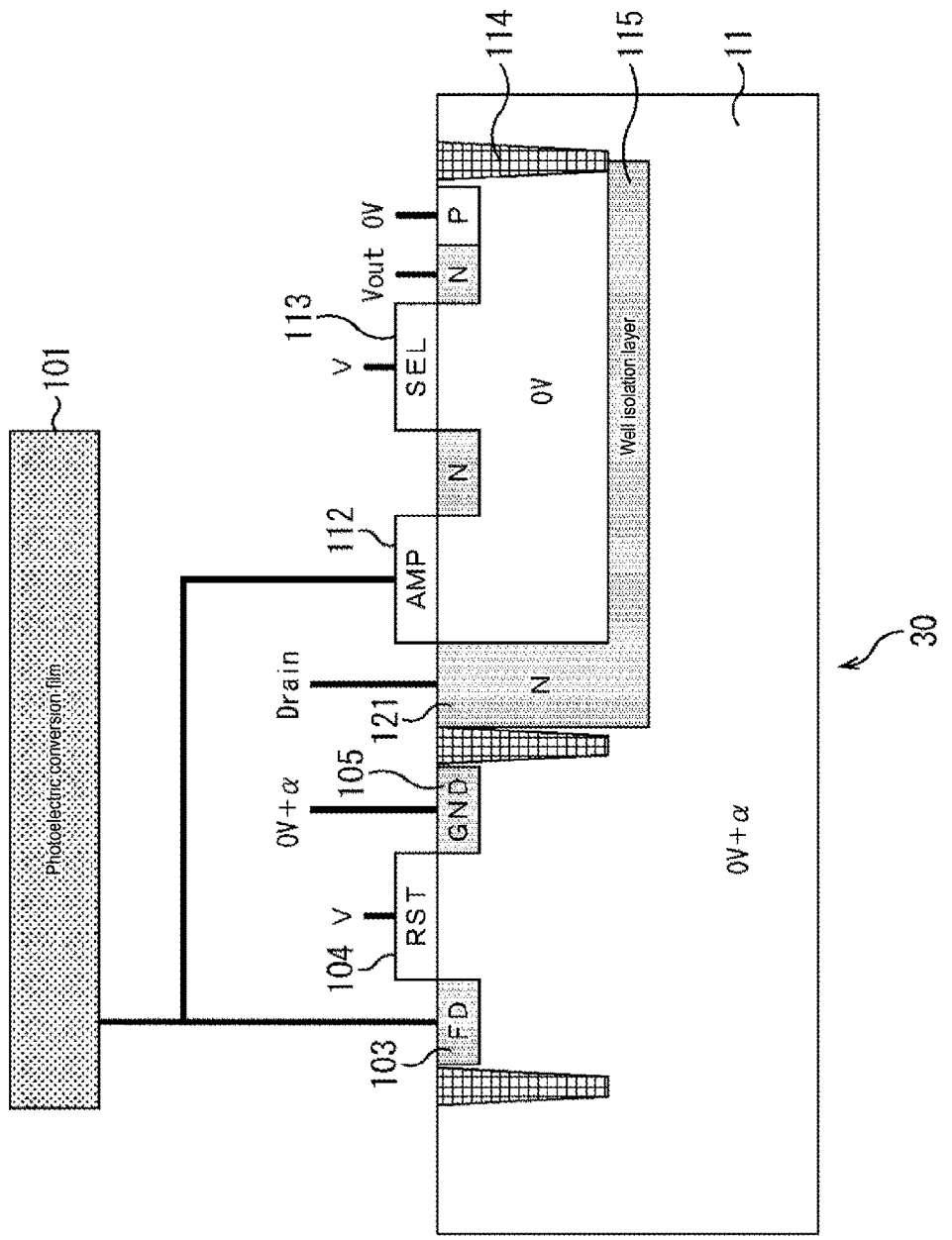
FIG. 19 is a cross-sectional diagram showing a configuration example having a well isolation layer.

Specifically, in the configuration example shown in FIG. 19, the well isolation layer 115 is extended below the AMP transistor 112 and the SEL transistor 113 from an N type region 121 connected to a drain. Also in this case, since the potential of the lower region below the AMP transistor 112 and the SEL transistor 113 is lower than the potential of the other well region, the above-described effects can be obtained.

In the configuration example shown in FIG. 20, the well isolation layer 115 is extended below the RST transistor 104 from the N type region 121 connected to a drain. A lower region below the RST transistor 104 of the well regions is electrically isolated from the other well region (region where the AMP transistor 112, the SEL transistor 113, and the like are formed), and the potential of the lower region is different from the potential of the other region. In this case, the potential of the lower region below the RST transistor 104 is higher than the potential of the other well region, and the above-described effects can be obtained.

It should be noted that the fifth modification example shown of FIG. 18 may be modified similarly to the configuration example shown in FIG. 20, and the lower region below the RST transistor 104 may be electrically isolated from the other well region (region where the AMP transistor 112, the SEL transistor 113, and the like are formed) by the well isolation layer 115 extending from the vertical transistor 51.

Figure 20:
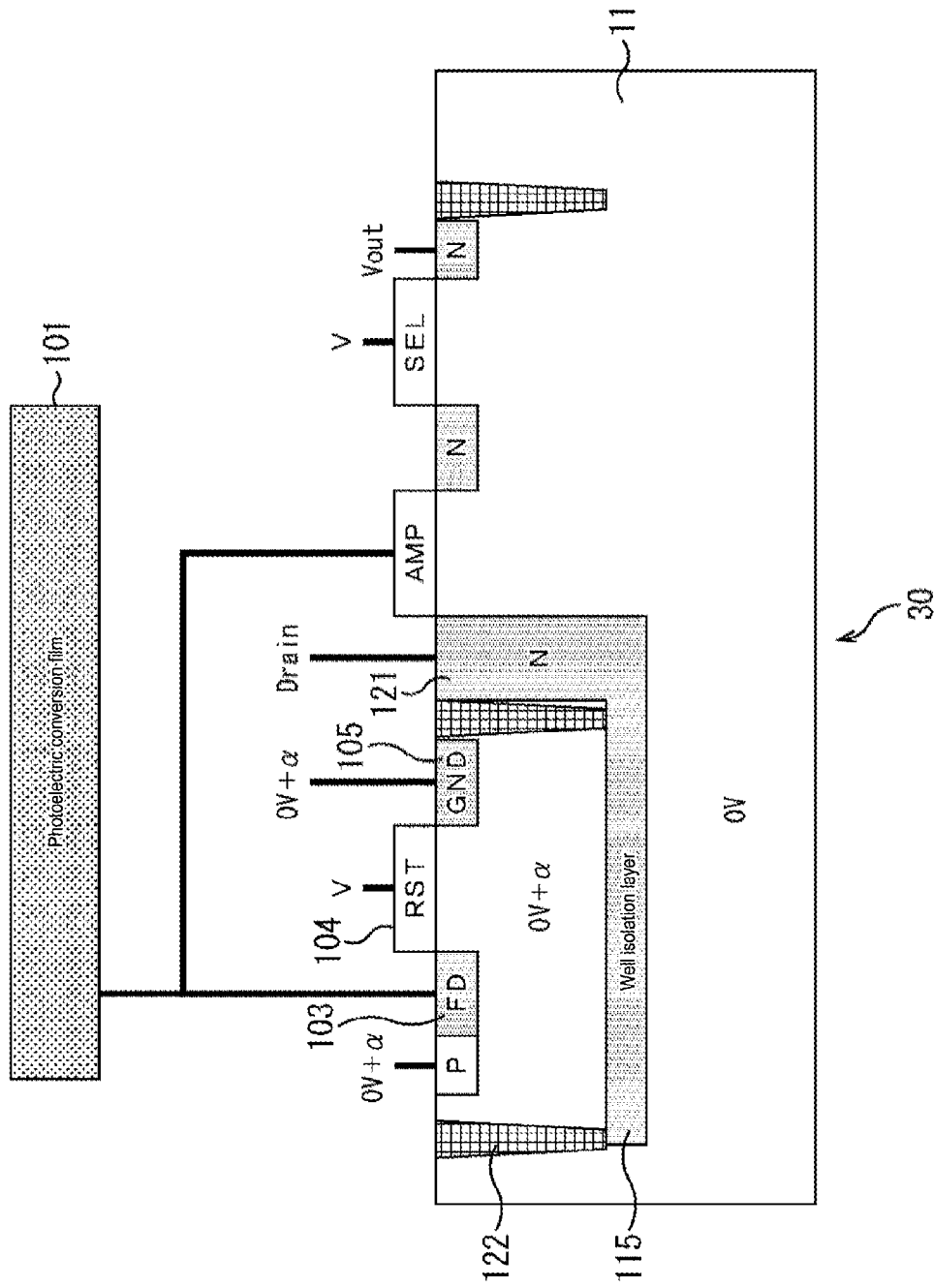
FIG. 20 is a cross-sectional diagram showing a configuration example having a well isolation layer.
Figure 21:
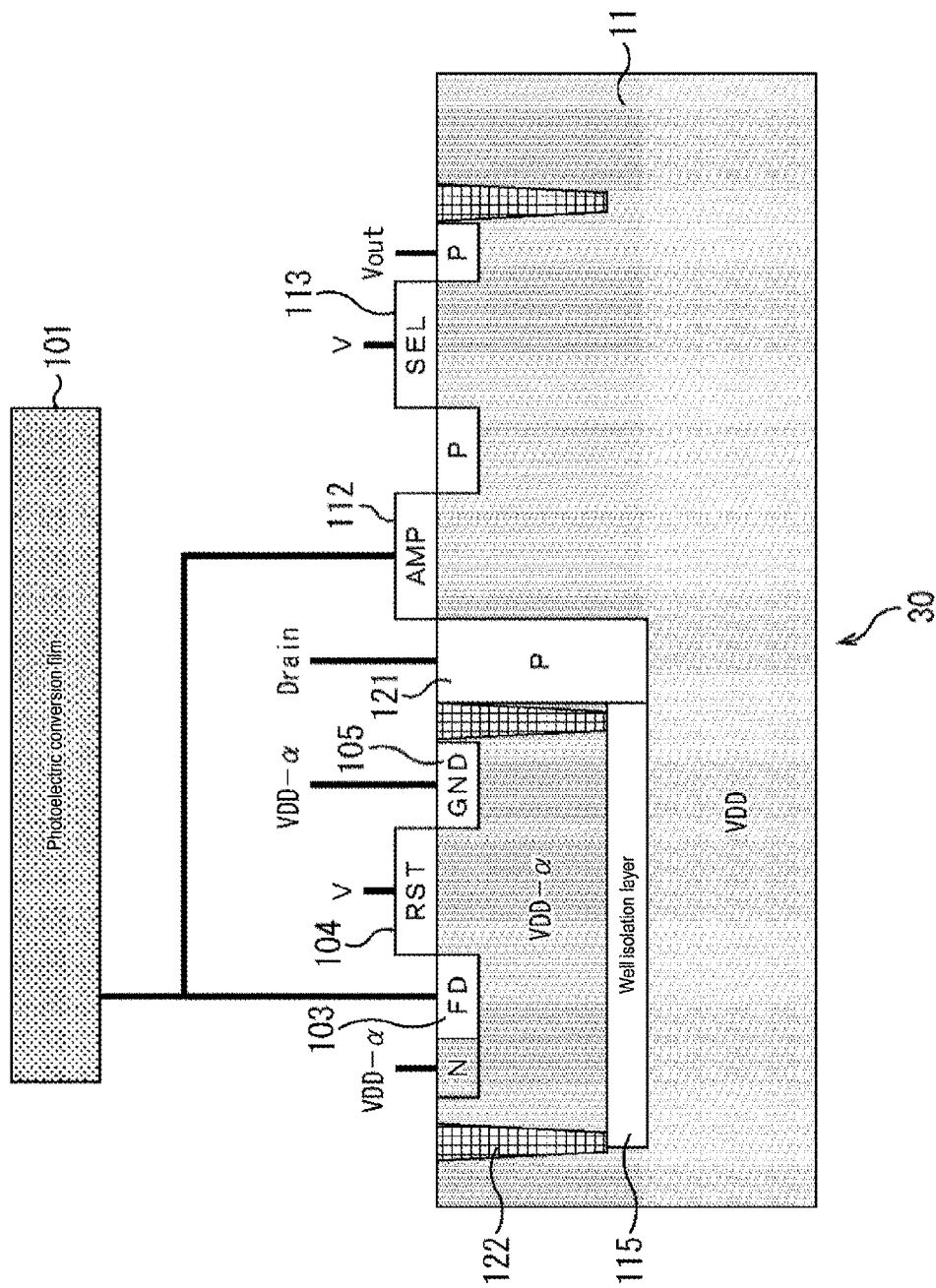
FIG. 21 is a cross-sectional diagram showing a configuration example having a well isolation layer.

In the configuration example shown in FIG. 21, electrical conductivity of each semiconductor in the configuration example shown in FIG. 20 is reversed. In this case, the potential of the lower region below the RST transistor 104 is lower than the potential of the other well region, and the above-described effects can be obtained.

Figure 22:
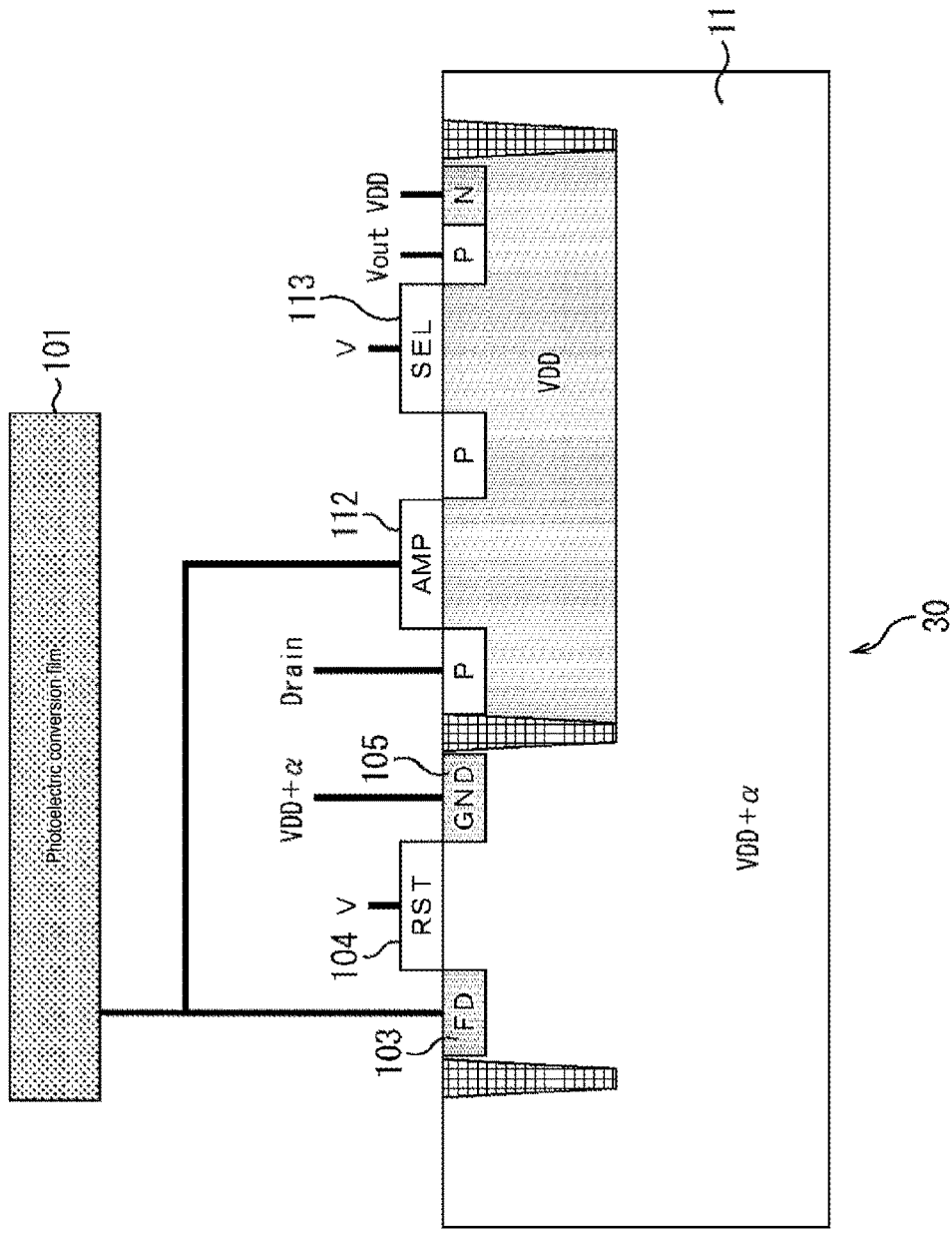
FIG. 22 is a cross-sectional diagram showing a configuration example using no well isolation layer that provides the similar effect.

In the configuration example shown in FIG. 22, the AMP transistor 112 and the SEL transistor 113 are formed of PMOS, and the N type well region is formed below the AMP transistor 112 and the SEL transistor 113. Thus, without forming the well isolation layer 115, a lower region below the AMP transistor 112 and the SEL transistor 113 is electrically isolated from the other well region where the RST transistor 104 and the like are formed, and the potential of the lower region is different from the potential of the other region. In this case, the potential of the lower region below the AMP transistor 112 and the SEL transistor 113 is higher than the potential of the other well region, the above-described effects can be obtained.

<Still Another Modification Example of Second Configuration Example of Solid-State Imaging Device According to Embodiment of the Present Technology>

Figure 23:
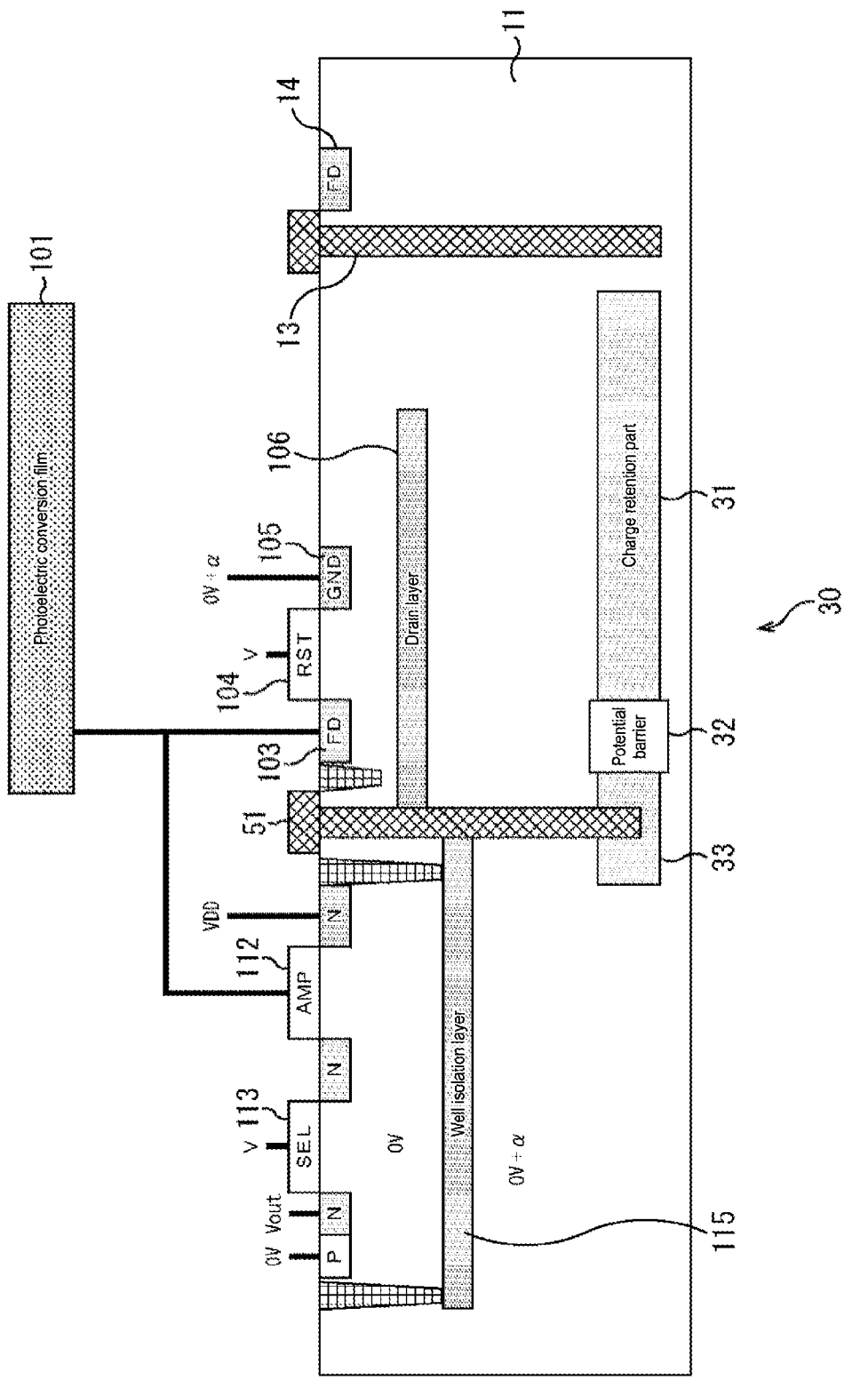
FIG. 23 is a cross-sectional diagram showing a modification example of the second configuration example to which a drain layer and a well isolation layer are added.
Figure 24:
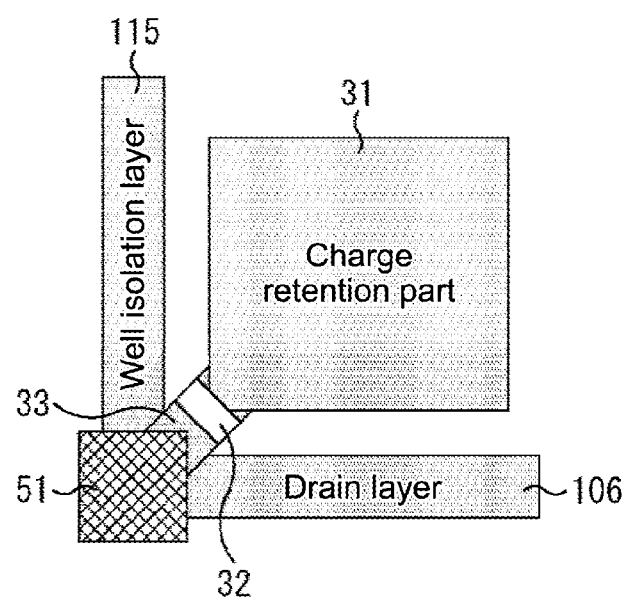
FIG. 24 is a top view of the modification example shown in FIG. 23.

Next, FIG. 23 shows still another modification example (sixth modification example) of the second configuration example of the solid-state imaging device shown in FIG. 5. Specifically, the fourth modification example shown in FIG. 17 is combined with the fifth modification example shown in FIG. 18. FIG. 24 is a top view of the sixth modification example shown in FIG. 23.

In the sixth modification example, by turning on the drain layer 106 at all times with electricity from the vertical transistor 51 connected to the power source, the drain layer 106 functions as a drain for collecting the charge leaking from the FD 103 and the GND terminal 105. As a result, an increase of dark current flowing through the charge retention part 31 can be inhibited.

Further, the well isolation layer 115 electrically isolates the lower region below the AMP transistor 112 and the SEL transistor 113 of the well regions from the other well region, and the potential of the lower region is different from the potential of the other region. In this manner, as the reset potential of the FD 103 can be arbitrarily set irrespective of the input voltage of the AMP transistor 112, it inhibits degradation of the imaging characteristics relating to random noises and a driving power (gm) arising from the operation point of the AMP transistor 112.

It should be noted that the above-described sixth modification example may be applied to the third configuration example shown in FIG. 8.

Figure 25:
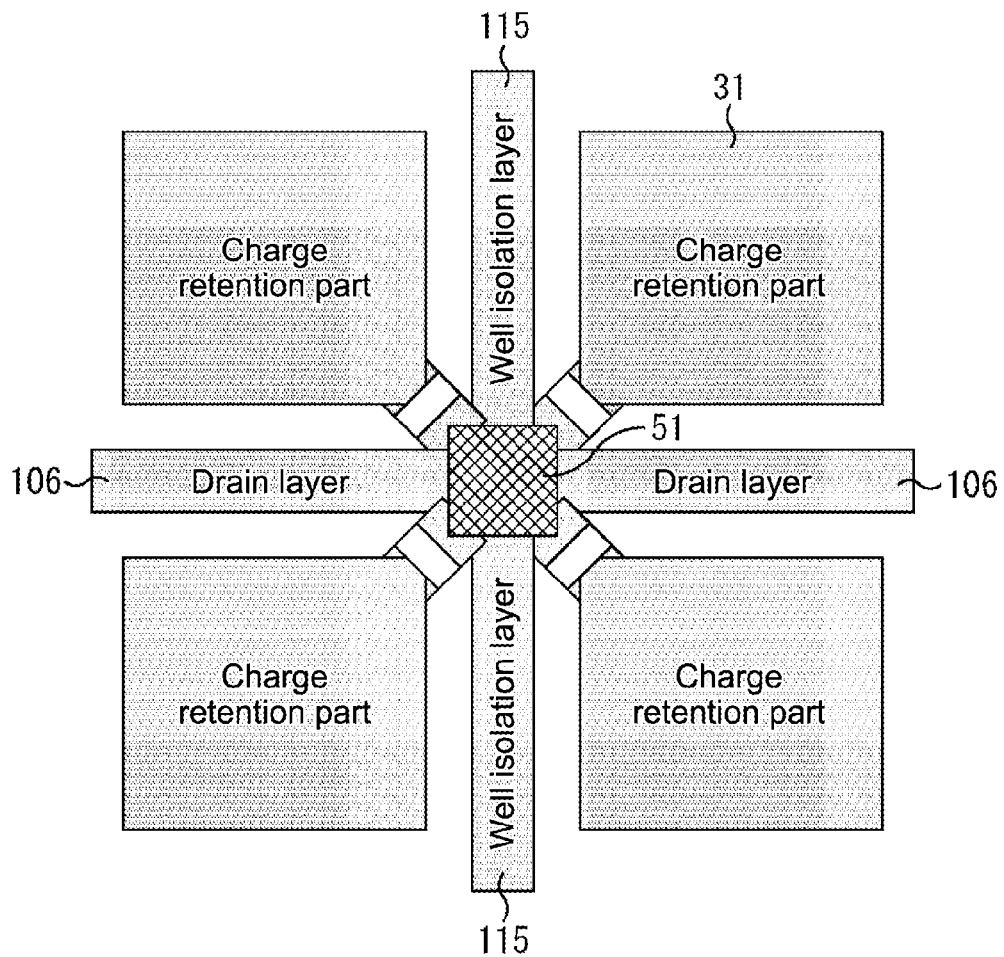
FIG. 25 is a top view showing a configuration example where a plurality of pixels share a vertical transistor.

Next, FIG. 25 is a top view showing a configuration example where a plurality of pixels share the vertical transistor 51 in the sixth modification example shown in FIG. 23. In this case, the area occupied by each pixel can be reduced in comparison with the case that the vertical transistor 51 is formed for each pixel.

<Usage Example of Solid-State Imaging Device 30>

Figure 26:
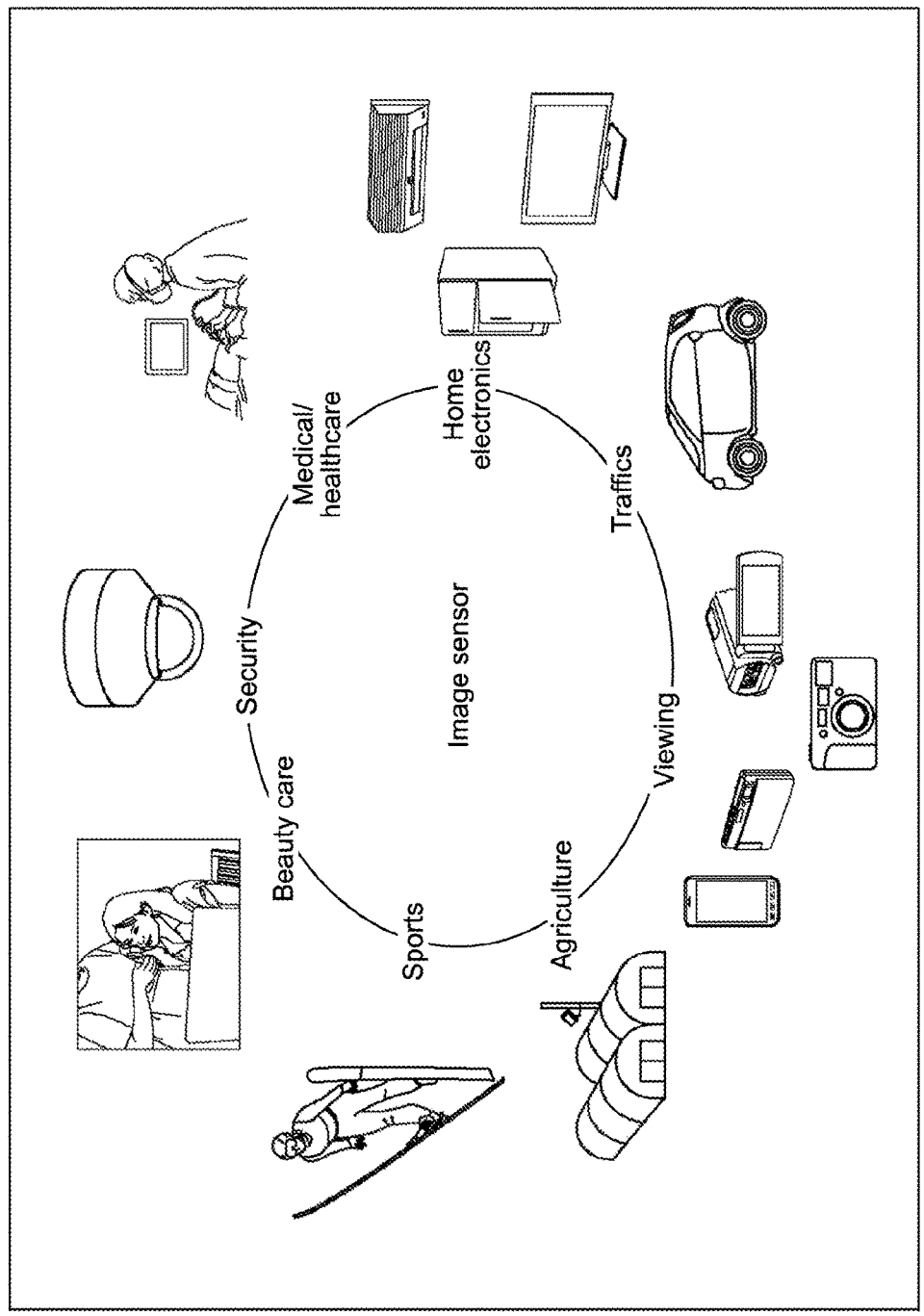
FIG. 26 is a diagram showing a usage example that uses the solid-state imaging device according to an embodiment of the present technology.

FIG. 26 is a diagram showing a usage example that uses the solid-state imaging device 30 according to an embodiment of the present technology.

The solid-state imaging device 30 can be used in various cases of sensing light such as visible light, infrared light, ultraviolet light, and X-rays as follows.

An apparatus for photographing images to be viewed, such as a digital camera and a camera-equipped mobile apparatus An apparatus used for traffic purposes, such as a car-mounted sensor that photographs front/rear/periphery/inside of an automobile, a surveillance camera that monitors running vehicles and roads, and a distance measurement sensor that measures distances among vehicles, for safe driving including automatic stop, recognition of a driver's state, and the like An apparatus used in home electronics such as a TV, a refrigerator, and an air conditioner, for photographing gestures of users and executing apparatus operations according to the gestures An apparatus used for medical and healthcare purposes, such as an endoscope and an apparatus that performs blood vessel photographing by receiving infrared light An apparatus used for security purposes, such as a surveillance camera for crime-prevention purposes and a camera for person authentication purposes An apparatus used for beauty care purposes, such as a skin measurement apparatus that photographs skins and a microscope that photographs scalps An apparatus used for sports purposes, such as an action camera and a wearable camera for sports purposes An apparatus for agriculture purposes, such as a camera for monitoring a state of fields and crops It should be noted that the embodiments of the present technology are not limited to the above-described examples and that various variations or modifications are possible without departing from the spirit and scope of the present technology.

The present technology may also have the following configurations.

(1) A solid-state imaging device, including:
 at a light receiving surface side of a semiconductor substrate,
 a charge retention part that generates and retains a charge in response to incident light;
 an OFD into which the charge saturated at the charge retention part is discharged; and
 a potential barrier that becomes a barrier of the charge that flows from the charge retention part to the OFD,
 the OFD including a low concentration OFD and a high concentration OFD having different impurity concentrations of the same type, and
 the high concentration OFD and the potential barrier being formed at a distance.

(2) The solid-state imaging device according to (1), in which
 the charge retention part and the low concentration OFD have an equal impurity concentration of the same type.

(3) The solid-state imaging device according to (1) or (2), further including:
 a first vertical transistor formed from a surface of the semiconductor substrate opposite to the light receiving surface and being in contact with the high concentration OFD.

(4) The solid-state imaging device according to (3), in which
 the first vertical transistor and the potential barrier are formed at a distance.

(5) The solid-state imaging device according to (3), further including:
 a drain layer extending in a horizontal direction from the first vertical transistor between a pixel transistor formed at the semiconductor substrate and the charge retention part.

(6) The solid-state imaging device according to (5), in which
 the drain layer is formed of a diffusion layer including impurities of the same type as the charge retention part.

(7) The solid-state imaging device according to any of (3) to (6), further including:
 a well isolation layer that electrically isolates a lower region of a predetermined pixel transistor from another region of well regions of the semiconductor substrate, and extends in a horizontal direction from the first vertical transistor.

(8) The solid-state imaging device according to (7), in which
 a potential of the lower region of the predetermined pixel transistor that is electrically isolated by the well isolation layer is lower than a potential of the other region.

(9) The solid-state imaging device according to (7) or (8), in which
 the predetermined pixel transistor is an AMP transistor and an SEL transistor.

(10) The solid-state imaging device according to (9), in which
 an RST potential being an input voltage of the AMP transistor as the predetermined pixel transistor is lower than a drain voltage of the AMP transistor.

(11) The solid-state imaging device according to (7), in which
 the predetermined pixel transistor is an RST transistor.

(12) The solid-state imaging device according to any of (1) to (11), further including:
 a second vertical transistor formed from a surface of the semiconductor substrate opposite to the light receiving surface that reads the charge from the charge retention part.

(13) The solid-state imaging device according to any of (1) to (12), in which
 a voltage is applied to the high concentration OFD, the voltage being higher than a voltage generated on the charge retention part when a charge is accumulated in the charge retention part.

(14) The solid-state imaging device according to any of (1) to (13), in which
 a voltage is applied to the high concentration OFD, the voltage being higher than a voltage generated on the charge retention part when a charge is accumulated in the charge retention part, and being supplied via a through electrode that penetrates through the semiconductor substrate from a surface opposite to the light receiving surface of the semiconductor substrate.

(15) The solid-state imaging device according to (14), in which
 the through electrode is formed for a plurality of pixels and is shared by the plurality of pixels.

(16) The solid-state imaging device according to any of (1) to (15), further including:
 a control unit that controls a potential of the potential barrier.

(17) The solid-state imaging device according to any of (1) to (16), in which
 the high concentration OFD is shared by the plurality of pixels.

(18) The solid-state imaging device according to any of (1) to (17), in which
 a plurality of layers of the charge retention part are laminated in the semiconductor substrate.

(19) The solid-state imaging device according to any of (1) to (18), further including:
 a photoelectric conversion film formed outside the light receiving surface of the semiconductor substrate.

(20) An electronic apparatus on which a solid-state imaging device is mounted,
 the solid-state imaging device including:
 at a light receiving surface side of a semiconductor substrate,
 a charge retention part that generates and retains a charge in response to incident light;
 an OFD into which the charge saturated at the charge retention part is discharged; and
 a potential barrier that becomes a barrier of the charge that flows from the charge retention part to the OFD, the OFD including a low concentration OFD and a high concentration OFD having different impurity concentrations of the same type, and the high concentration OFD and the potential barrier being formed at a distance.

REFERENCE SIGNS LIST 30 solid-state imaging device
31 charge retention part
32 potential barrier
33 low concentration OFD
34 high concentration OFD
51 vertical transistor
52 OFD
71 power source
73 through electrode
81 gate electrode
82 vertical transistor
91 PD
92 photoelectric conversion film
101 photoelectric conversion film
106 drain layer
115 well isolation layer

What is claimed is:

1. A solid-state imaging device, comprising:
   at a light receiving surface side of a semiconductor substrate,
   a charge retention part that generates and retains a charge in response to incident light;
   an overflow drain (OFD) into which the charge saturated at the charge retention part is discharged; and
   a potential barrier that becomes a barrier of the charge that flows from the charge retention part to the OFD,
   the OFD including a low concentration OFD and a high concentration OFD and
   the high concentration OFD and the potential barrier are separated by the low concentration OFD.

2. The solid-state imaging device according to claim 1, wherein the charge retention part and the low concentration OFD have an equal impurity concentration of the same type.

3. The solid-state imaging device according to claim 2, further comprising:
   a first vertical transistor formed from a surface of the semiconductor substrate opposite to the light receiving surface and being in contact with the high concentration OFD.

4. The solid-state imaging device according to claim 3, wherein the first vertical transistor and the potential barrier are formed at a distance.

5. The solid-state imaging device according to claim 3, further comprising:
   a drain layer extending in a horizontal direction from the first vertical transistor between a pixel transistor formed at the semiconductor substrate and the charge retention part.

6. The solid-state imaging device according to claim 5, wherein the drain layer is formed of a diffusion layer including impurities of the same type as the charge retention part.

7. The solid-state imaging device according to claim 3, further comprising:
   a well isolation layer that electrically isolates a lower region of a predetermined pixel transistor from another region of well regions of the semiconductor substrate, and extends in a horizontal direction from the first vertical transistor.

8. The solid-state imaging device according to claim 7, wherein a potential of the lower region of the predetermined pixel transistor that is electrically isolated by the well isolation layer is lower than a potential of the another region.

9. The solid-state imaging device according to claim 7, wherein the predetermined pixel transistor is an AMP transistor and an SEL transistor.

10. The solid-state imaging device according to claim 9, wherein an RST potential being an input voltage of the AMP transistor as the predetermined pixel transistor is lower than a drain voltage of the AMP transistor.

11. The solid-state imaging device according to claim 7, wherein the predetermined pixel transistor is an RST transistor.

12. The solid-state imaging device according to claim 2, further comprising:
    a second vertical transistor formed from a surface of the semiconductor substrate opposite to the light receiving surface that reads the charge from the charge retention part.

13. The solid-state imaging device according to claim 2, wherein a voltage is applied to the high concentration OFD, the voltage being higher than a voltage generated on the charge retention part when a charge is accumulated in the charge retention part.

14. The solid-state imaging device according to claim 13, wherein a voltage is applied to the high concentration OFD, the voltage being higher than a voltage generated on the charge retention part when a charge is accumulated in the charge retention part, and being supplied via a through electrode that penetrates through the semiconductor substrate from a surface opposite to the light receiving surface of the semiconductor substrate.

15. The solid-state imaging device according to claim 14, wherein the through electrode is formed for a plurality of pixels and is shared by the plurality of pixels.

16. The solid-state imaging device according to claim 2, further comprising:
    a control unit that controls a potential of the potential barrier.

17. The solid-state imaging device according to claim 2, wherein the high concentration OFD is shared by a plurality of pixels.

18. The solid-state imaging device according to claim 2, wherein a plurality of layers of the charge retention part are laminated in the semiconductor substrate.

19. The solid-state imaging device according to claim 2, further comprising:
    a photoelectric conversion film formed outside the light receiving surface of the semiconductor substrate.

20. An electronic apparatus on which a solid-state imaging device is mounted, the solid-state imaging device comprising:
    at a light receiving surface side of a semiconductor substrate,
    a charge retention part that generates and retains a charge in response to incident light;
    an overflow drain (OFD) into which the charge saturated at the charge retention part is discharged; and
    a potential barrier that becomes a barrier of the charge that flows from the charge retention part to the OFD,
    the OFD including a low concentration OFD and a high concentration OFD having different impurity concentrations of the same type, and the high concentration OFD and the potential barrier are separated by the low concentration OFD.

* * * * *